(12) United States Patent
Wang et al.

(10) Patent No.: US 12,152,315 B2
(45) Date of Patent: Nov. 26, 2024

(54) METHODS AND DEVICES FOR GROWING SCINTILLATION CRYSTALS WITH MULTI-COMPONENT GARNET STRUCTURE

(71) Applicant: MEISHAN BOYA ADVANCED MATERIALS CO., LTD., Sichuan (CN)

(72) Inventors: Yu Wang, Meishan (CN); Weiming Guan, Meishan (CN); Min Li, Meishan (CN)

(73) Assignee: MEISHAN BOYA ADVANCED MATERIALS CO., LTD., Meishan (CN)

(*) Notice: Subject to any disclaimer, the term of this patent is extended or adjusted under 35 U.S.C. 154(b) by 235 days.

(21) Appl. No.: 17/227,264

(22) Filed: Apr. 9, 2021

(65) Prior Publication Data
US 2021/0230767 A1 Jul. 29, 2021

Related U.S. Application Data

(63) Continuation of application No. PCT/CN2019/101691, filed on Aug. 21, 2019.

(51) Int. Cl.
| | | |
|---|---|---|
| *C30B 29/28* | (2006.01) | |
| *C30B 15/02* | (2006.01) | |
| *C30B 15/20* | (2006.01) | |
| *C30B 15/30* | (2006.01) | |

(52) U.S. Cl.
CPC ............ *C30B 29/28* (2013.01); *C30B 15/02* (2013.01); *C30B 15/20* (2013.01); *C30B 15/30* (2013.01)

(58) Field of Classification Search
CPC ......... C30B 15/00; C30B 15/02; C30B 15/20; C30B 15/30; C30B 27/02; C30B 29/28
See application file for complete search history.

(56) References Cited

U.S. PATENT DOCUMENTS

| | | | |
|---|---|---|---|
| 4,534,821 A | 8/1985 | Sakaguchi et al. | |
| 5,164,041 A * | 11/1992 | Berkstresser | ........... C30B 29/34 |
| | | | 117/906 |

(Continued)

FOREIGN PATENT DOCUMENTS

| | | |
|---|---|---|
| CN | 101871126 A | 10/2010 |
| CN | 103074685 A | 5/2013 |

(Continued)

OTHER PUBLICATIONS

European Patent Office, English computer translation of JP 2008-169095 (Year: 2020).*

(Continued)

*Primary Examiner* — Matthew J Song
(74) *Attorney, Agent, or Firm* — METIS IP LLC

(57) ABSTRACT

The present disclosure provides a method for growing scintillation crystals with multi-component garnet structure. According to the method, through weight compensating for reactants, introducing a flowing gas, adopting a new temperature field device, and optimizing process parameters, problems such as component deviation and crystal cracking during the crystal growth can be solved to a certain extent, and grown crystals have consistent performance and good repeatability.

17 Claims, 9 Drawing Sheets

(56) References Cited

U.S. PATENT DOCUMENTS

| | | | |
|---|---|---|---|
| 5,660,627 A * | 8/1997 | Manente | C30B 29/34 117/15 |
| 6,348,095 B1 * | 2/2002 | Watanabe | C30B 29/06 117/202 |
| 2008/0299027 A1 * | 12/2008 | Kurata | C30B 33/02 423/263 |
| 2013/0291788 A1 * | 11/2013 | Houzvicka | C30B 15/22 117/15 |
| 2015/0353822 A1 * | 12/2015 | Tyagi | C30B 15/04 250/361 R |
| 2019/0169499 A1 * | 6/2019 | Cohen | C09K 11/7774 |

FOREIGN PATENT DOCUMENTS

| | | | | |
|---|---|---|---|---|
| CN | 104674344 A * | 6/2015 | | C30B 27/02 |
| CN | 104962994 A | 10/2015 | | |
| CN | 103397385 B | 4/2016 | | |
| CN | 106087037 A | 11/2016 | | |
| CN | 106119965 A | 11/2016 | | |
| CN | 106149054 A | 11/2016 | | |
| CN | 106381524 A * | 2/2017 | | C30B 29/40 |
| CN | 106978629 A | 7/2017 | | |
| CN | 107245759 A | 10/2017 | | |
| CN | 108360062 A | 8/2018 | | |
| CN | 108441959 A | 8/2018 | | |
| CN | 108866627 A | 11/2018 | | |
| GB | 2047113 A | 11/1980 | | |
| JP | 2008169095 A * | 7/2008 | | C30B 29/22 |

OTHER PUBLICATIONS

European Patent Office, English computer translation of CN104674344 (Year: 2023).*

English computer translation of CN 106381524 (Year: 2023).*

International Search Report in PCT/CN2019/101691 mailed on May 27, 2020, 9 Pages.

Feng, Dajian et al., Study on the Growth and Scintillation Properties of Ce: GAGG Crystal, Piezoelectrics & Acoustooptics, 38(3): 430-432, 2016.

H. Sato et al., Growth and Characterization of Ce: $Gd_3(Al, Ga)_5O_{12}$ Single Crystals with Various Ratio of Ga to Al, Journal of Crystal Growth, 468: 361-364, 2016.

Kei Kamada et al., Crystal Growth and Scintillation Properties of Ce Doped $Gd_3(Ga, Al)_5O_{12}$ Single Crystals, IEEE, 59(5): 2112-2115, 2012.

Winicjusz Drozdowski et al., Scintillation Properties of $Gd_3Al_2Ga_3O_{12}$: Ce(GAGG: Ce): A Comparison Between Monocrystalline and Nanoceramic Samples, Optical Material, 79: 227-231, 2018.

The Extended European Search Report in European Application No. 19941845.0 mailed on Jan. 10, 2022, 14 pages.

* cited by examiner

METHODS AND DEVICES FOR GROWING SCINTILLATION CRYSTALS WITH MULTI-COMPONENT GARNET STRUCTURE

CROSS-REFERENCE TO RELATED APPLICATIONS

This application is a Continuation of International Application No. PCT/CN2019/101691 filed on Aug. 21, 2019, the entire contents of which are hereby incorporated by reference.

TECHNICAL FIELD

The present disclosure relates to the field of crystal growth, and in particular, to methods and devices for growing ion-doped scintillation crystals with multi-component garnet structure.

BACKGROUND

Scintillation crystal is used as an energy conversion medium that can convert ionizing radiation energy (e.g., a gamma-ray, an X-ray) into light energy (e.g., visible light). With the rapid development of science and technology, scintillation crystals with high-performance such as BGO, BSO, GSO, LSO, LYSO, etc., are widely used in fields including nuclear medicine field such as X-ray tomography (CT) and positron emission tomography (PET), nuclear detection field such as industrial tomography (e.g., industrial CT), oil well exploration, nuclear physics, high-energy physics, environmental inspection, safety monitoring, weapon fire control and guidance, etc. In recent years, cerium ion-doped scintillation crystals with multi-component garnet structure have become a research hotspot in the field of scintillation crystals. On the basis of the garnet structure ($A_3B_5O_{12}$, A=Lu/Y/La/Gd/Yb, B=Al/Ga/In/Sc), adjusting an electronic structure of a crystal (i.e., a band gap engineering) by adjusting element compositions of A/B lattice in the crystal (i.e., a component engineering) can effectively inhibit the trapping of electron-hole pairs by electron traps caused by intrinsic defects and increase a light output of the crystal. The mixed crystal $Ce^{3+}:Gd_3Ga_{5x}Al_{5(1-x)}O_{12}$ (0<X<1, Ce:GAGG for short) formed by Gd atoms occupying the A lattice and Al and Ga atoms occupying the B lattice is an oxide scintillation crystal with the highest light output in the world. The light output of the mixed crystal can reach up to 74000±7400 photons/MeV, which is 3 times that of Ce:LYSO. Meanwhile, in addition to the high light output, Ce:GAGG has characteristics such as a cubic structure, a large density, a rapid attenuation, etc., making it the most promising scintillation material. However, due to that the Ce:GAGG crystal has a low thermal conductivity, gallium oxide is easy to volatilize, and crystal crack and component deviation are easy to occur during the crystal growth, it is difficult to obtain an crystal with large-size and uniform scintillation performance.

SUMMARY

The present disclosure discloses a method for growing a crystal. According to the method, the crystal growth has surprisingly excellent repeatability and qualities of crystals grown in different times can achieve surprising consistency, which can solve problems that gallium oxide is easy to volatile, the crystal is easy to crack and has component deviation during the crystal growth, and it is difficult to obtain crystals with large-size and uniform scintillation performance.

According to some embodiment of the present disclosure, a crystal is provided. A formula of the crystal may be $A_{3y}B_{5x}O_{12}$. A may consist of at least one of lanthanide, at least one of actinide, or at least one of yttrium. B may consist of at least one of aluminum, gallium, indium or scandium. x=0.0001~0.5, and y=0.00001~0.06.

In some embodiments, A may consist of cerium and gadolinium, and B may consist of aluminum and gallium. The formula of the crystal may be $(Ce_yGd_{1-y})(Al_xGa_{1-x})_5O_{12}$.

According to some embodiment of the present disclosure, a method for growing a crystal is provided. The method may include weighting reactants based on a molar ratio of the reactants according to a reaction equation for generating the crystal after a first preprocessing operation is performed on reactants, wherein x=0.01%~50%, and y=0.001%-6%; placing reactants, on which a second preprocessing operation has been performed into a crystal growth device; introducing a flowing gas into the crystal growth device after sealing the crystal growth device; and activating the crystal growth device to grow the crystal based on a Czochralski technique.

In some embodiments, B may include gallium and a weight of a reactant containing gallium may exceed 0.01%~10% of a weight of the reactant containing gallium determined according to the reaction equation or a total weight of the reactants determined according to the reaction equation.

One of the embodiments of the present disclosure provides methods for growing a crystal, and the method may include: weighting reactants based on a molar ratio of the reactants according to a reaction equation (1) after a first preprocessing operation is performed on the reactants, $6yCeO_2+3(1-y)Gd_2O_3+5xAl_2O_3+5(1-x)Ga_2O_3 \rightarrow 2(Ce_yGd_{1-y})(Al_xGa_{1-x})_5O_{12}+02$ 1' (1), wherein x=0.01%~50%, y=0.001%~6%, and a weight of $Ga_2O_3$ exceeds 0.01%~10% of a weight of $Ga_2O_3$ determined according to the reaction equation (1) or a total weight of the reactants determined according to the reaction equation (1); placing the reactants, on which a second preprocessing operation has been performed, into a crystal growth device; introducing a flowing gas into the crystal growth device after sealing the crystal growth device; and activating the crystal growth device to grow the crystal based on a Czochralski technique.

In some embodiments, a purity of each of the reactants may be greater than 99%, the purity of each of the reactants may be greater than 99.9%, the purity of each of the reactants may be greater than 99.99%, or the purity of each of the reactants may be greater than 99.999%.

In some embodiments, the first preprocessing operation may include a roasting operation under 800° C.~1300° C.; and the second preprocessing operation may include at least one of a room temperature mixing operation or a pressing operation.

In some embodiments, the flowing gas may include one or more of oxygen, nitrogen, carbon dioxide, or inert gas, the flowing gas may include a mixed gas of oxygen and one or more of nitrogen or inert gas, or the flowing gas includes a mixed gas of carbon dioxide and one or more of nitrogen or inert gas.

In some embodiments, when the flowing gas includes a mixed gas of oxygen and one or more of nitrogen, argon or inert gas, a volume ratio of oxygen may be 0.001%~10%.

In some embodiments, when the flowing gas includes a mixed gas of carbon dioxide and one or more of nitrogen or inert gas, a volume ratio of carbon dioxide may be 0.001%~25%.

In some embodiments, a flow rate of the flowing gas may be 0.01 L/min~50 L/min.

In some embodiments, a purity of the flowing gas may be greater than 99%, the purity of the flowing gas may be greater than 99.9%, the purity of the flowing gas may be greater than 99.99%, or the purity of the flowing gas may be greater than 99.999%.

In some embodiments, a rotation rate of a pulling rod of the crystal growth device during the crystal growth may be 0.01 rpm~35 rpm.

In some embodiments, a growth rate of the crystal may be 0.01 mm/h~6 mm/h during the crystal growth.

In some embodiments, a temperature decreasing time length of the crystal during the crystal growth may be 20 hours~100 hours.

In some embodiments, a distance between a seed crystal and an upper surface of the reactants may be 5 mm~100 mm during melting the reactants.

In some embodiments, the method may include comprising causing a seed crystal to be sunk to 0.1 mm~50 mm below a surface of a melt of the reactants by controlling a pulling rod during a temperature adjustment; and causing, after the temperature adjustment, the seed crystal to be pulled upwards under a constant temperature at 1900° C.~1930° C. for at least 0.1 hours~2 hours.

In some embodiments, during an ending process of the crystal growth, an ending angle may be 30 degrees~70 degrees, and an ending length may be 40-110 mm.

In some embodiments, the crystal growth may be controlled by a proportion, integral, differential (PID) controller. A PID parameter may be 0.1~5.

Another aspect of the present disclosure provides devices for growing a crystal. The device may include a temperature field device, and the temperature field device may include a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be filled inside the drum.

Another aspect of the present disclosure provides devices for growing a crystal. The device may include a temperature field device. The temperature field device may include a bottom plate, a cover plate, a first drum, a second drum, and a filler. The bottom plate may be mounted on a bottom of the temperature field device and cover an open end of the first drum. The cover plate may be mounted on a top of the temperature field device and cover the other open end of the first drum. The second drum may be mounted inside the first drum. The filler may be filled inside the second drum and/or a space between the second drum and the first drum.

In some embodiments, the filler filled inside the second drum may be at least configured to support a crucible and cover a portion of the crucible. Reactants used for growing the crystal may be placed in the crucible for reaction.

In some embodiments, the first drum may include a quartz tube, a corundum tube, or is made of a heat resistant material.

In some embodiments, the filler may include a granule shaped filler, a brick shaped filler, and/or a felt shaped filler, and the filler may be made of a heat resistant material.

In some embodiments, a particle size of the granule shaped filler may be 5 mesh~200 mesh.

In some embodiments, an amount and a tightness of the filler may be adjusted according to a crystal growth condition.

In some embodiments, a filling height of the filler may result in that a vertical distance between an upper edge of the crucible supported by the filler and an upper edge of an induction coil mounted outside the temperature field device is 0 mm~∓50 mm. "−" may represent that the upper edge of the crucible is lower than an upper edge of the induction coil, and "+" may represent that the upper edge of the crucible is higher than the upper edge of the induction coil.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

DETAILED DESCRIPTION

Figure 1:
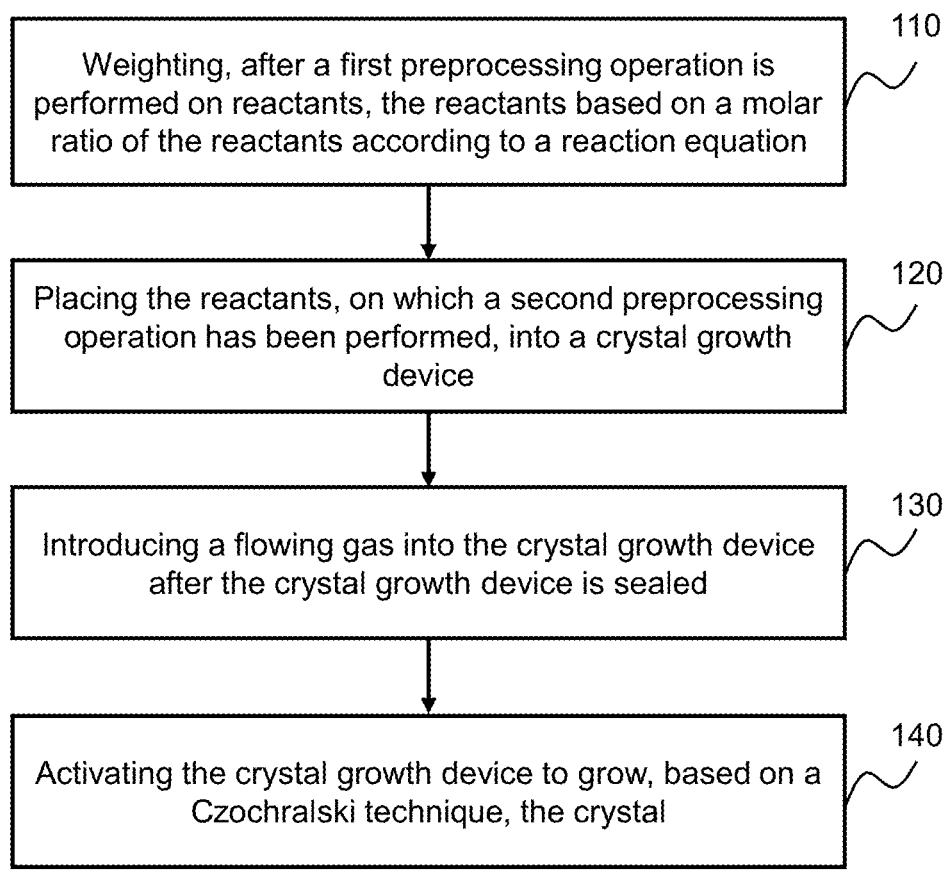
FIG. 1 is a flowchart illustrating an exemplary process for growing a crystal according to some embodiments of the present disclosure.

In order to more clearly illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that the "system," "device," "unit," and/or "module" used herein are one method to distinguish different components, elements, parts, sections or assemblies of different levels. However, if other words can achieve the same purpose, the words can be replaced by other expressions.

As used in the disclosure and the appended claims, the singular forms "a," "an," and "the" include plural referents unless the content clearly dictates otherwise. In general, the terms "comprise," "comprises," and/or "comprising,"

"include," "includes," and/or "including," merely prompt to include steps and elements that have been clearly identified, and these steps and elements do not constitute an exclusive listing. The methods or devices may also include other steps or elements.

The range of values used herein in the present disclosure briefly illustrate each value in the range of values.

The flowcharts used in the present disclosure illustrate operations that the system implements according to the embodiment of the present disclosure. It should be understood that the foregoing or following operations may not necessarily performed exactly in order. Instead, the operations may be processed in reverse order or simultaneously. Besides, one or more other operations may be added to these processes, or one or more operations may be removed from these processes.

A crystal is disclosed according to some embodiments of the present disclosure. The crystal may have a basic structure similar to a garnet structure. In some embodiments, a formula of the crystal may be $A_{3y}B_{5x}O_{12}$. A may consist of at least one of lanthanide, at least one of actinide, or at least one of yttrium. B may consist of at least one of aluminum, gallium, indium or scandium. When A or B consists of two or more elements, the crystal may be regarded as a doping crystal. In some embodiments, when A consists of cerium, the crystal may be regarded as a cerium-doped crystal with multi-component garnet, which may be used as a practical scintillation crystal. In some embodiments, A may consist of cerium and gadolinium, and B may consist of aluminum and gallium. In such cases, the formula of the crystal may be $(Ce_yGd_{1-y})_3(Al_xGa_{1-x})_5O_{12}$. In some embodiments, a value of x may be 0.0001~0.5. The value of x may also be 0.001~0.5. The value of x may also be 0.01~0.5. The value of x may also be 0.1~0.5. The value of x may also be 0.1~0.4. The value of x may also be 0.2~0.3. The value of x may also be 0.21~0.29. The value of x may also be 0.22~0.28. The value of x may also be 0.23~0.27. The value of x may also be 0.24~0.26. A value of y may be 0.00001~0.06. The value of y may also be 0.0001~0.06. The value of y may also be 0.001~0.06. The value of y may also be 0.01~0.06. The value of y may also be 0.02~0.05. The value of y may also be 0.03~0.04. The value of y may also be 0.031~0.039. The value of y may also be 0.032~0.038. The value of y may also be 0.033~0.037. The value of y may also be 0.034~0.036. For example, when x=0.1 or 0.2, y=0.003.

In some embodiments, the crystal may be prepared by the following method.

In a first step, reactants may be weighted based on a molar ratio of the reactants according to a reaction equation for generating the crystal after a first preprocessing operation is performed on the reactants. In some embodiments, the crystal may be grown from a melt of a mixture of an oxide of A and an oxide of B. The reaction equation may include oxide reactants used for growing the crystal. In order to remove substances such as water and other organic substance(s) of metal element(s) to improve the purity of the reactants, the first preprocessing operation may be performed on each of the reactants respectively. For example, a high-temperature roasting operation may be used to remove water and the organic substance(s). The high-temperature roasting operation may be performed using a commercially available high-temperature roasting device, for example, a muffle furnace. In some embodiments, a roasting temperature of the reactants may be 800° C.~1400° C. More preferably, the roasting temperature of the reactants may be 900° C.~1300° C. More preferably, the roasting temperature of the reactants may be 1000° C.~1200° C. More preferably, the roasting temperature of the reactants may be 1050° C.~1150° C. More preferably, the roasting temperature of the reactants may be 1060° C.~1140° C. More preferably, the roasting temperature of the reactants may be 1070° C. to 1130° C. More preferably, the roasting temperature of the reactants may be 1080° C.~1120° C. More preferably, the roasting temperature of the reactants may be 1090° C. to 1110° C. According to characteristics of different reactants, a time length of high-temperature roasting may be no less than 5 hours.

For crystals with different molecular formulas, different weighting manners may be used for weighing the reactants. In some embodiments, when B consists of gallium, a weight of a reactant containing gallium may exceed 0.01%~10% of a weight of the reactant containing gallium determined according to the reaction equation or a total weight of the reactants determined according to the reaction equation. The weight of the reactant containing gallium may exceed 0.1%~10% of the weight of the reactant containing gallium determined according to the reaction equation or a total weight of the reactants determined according to the reaction equation. The weight of the reactant containing gallium may exceed 1%~10% of the weight of the reactant containing gallium determined according to the reaction equation or a total weight of the reactants determined according to the reaction equation. The weight of the reactant containing gallium may exceed 2%~9% of the weight of the reactant containing gallium determined according to the reaction equation or a total weight of the reactants determined according to the reaction equation. The weight of the reactant containing gallium may exceed 3%~8% of the weight of the reactant containing gallium determined according to the reaction equation or a total weight of the reactants determined according to the reaction equation. The weight of the reactant containing gallium may exceed 4%~7% of the weight of the reactant containing gallium determined according to the reaction equation or a total weight of the reactants determined according to the reaction equation. The weight of the reactant containing gallium may exceed 5%~6% of the weight of the reactant containing gallium determined according to the reaction equation or a total weight of the reactants determined according to the reaction equation. For example, the molecular formula of the crystal may be, for example, $A_{3y}B_{5x}O_{12}$. When x=0.1 or 0.2 and y=0.003, the weight of the reactant containing gallium may exceed 2% of the weight of the reactant containing gallium determined according to the reaction equation or a total weight of the reactants determined according to the reaction equation.

In a second step, the reactants, on which a second preprocessing operation has been performed, may be placed into a crystal growth device.

In some embodiments, the second preprocessing operation may include a room temperature mixing operation, a pressing operation, or the like, or any combination thereof. It can be understood that uniformly mixed reactants are conducive to subsequent crystal growth. Exemplary mixing device may include but is not limited to a three-dimensional motion mixer, a double cone mixer, a vacuum mixer, a colter mixer, a V-type mixer, a conical twin-screw screw mixer, a planetary mixer, a horizontal screw mixer, etc. A mixing time length of the reactants may be 0.5 hours~48 hours. Preferably, the mixing time length may be 1 hours~48 hours. More preferably, the mixing time length may be 6 hours~42 hours. More preferably, the mixing time length may be 12 hours~36 hours. More preferably, the mixing time length may be 18 hours~30 hours. More preferably, the mixing time length may be 21 hours~27 hours.

The pressing operation may refer to an operation in which a certain pressure may be applied to the reactants to transform the reactants from a dispersed state into a body with an initial shape (e.g., a cylindrical shape). The pressed reactants may have a volume smaller than that of the reactants in the dispersed state and may be easier to be placed into a reaction place. For example, the pressed reactants may be easily placed into a reaction crucible in one time. In some embodiments, the pressing operation may discharge air contained in the reactants in the dispersed state to reduce an impact of the air on the crystal growth in subsequent reactions. The pressing operation may be performed by an isostatic pressing device such as a cold isostatic pressing device. The reactants may be placed in a pressing tank and pressed into shape. A pressure used during the pressing operation may be 100 MPa~300 MPa. Preferably, the pressure used during the pressing operation may be 150 MPa~250 MPa. More preferably, the pressure used during the pressing operation may be 160 MPa~240 MPa. More preferably, the pressure used during the pressing operation may be 170 MPa~230 MPa. More preferably, the pressure used during the pressing operation may be 180 MPa~220 MPa. More preferably, the pressure used during the pressing operation may be 190 MPa~210 MPa. More preferably, the pressure used during the pressing operation may be 200 MPa.

In some embodiments, the crystal growth device may include a single-crystal growth furnace and a temperature field device. A type of the single-crystal growth furnace may include an open type or a vacuum type, which is not limited in the present disclosure. The temperature field device may be used in the single-crystal growth furnace to provide a temperature gradient for crystal growth and ensure the stability of a crystallization process of the crystal. A temperature field with good symmetry and good stability may avoid problems of cracking and abnormal growth during the crystal growth. The temperature field device may include a first hollow column and two cover plates covering two ends of the first hollow column, respectively. In some embodiments, the two cover plates may be connected to the two ends of the first hollow column, and the connection may include a bonding connection, a welding connection, a riveting connection, a key connection, a bolt connection, a buckle connection, or the like, or any combination thereof. Alternatively, one end of the first hollow column may be connected to one cover plate (e.g., via a detachable connection), and the other end of the first hollow column may be integrally formed with the other cover plate or connected to the other cover plate via a non-detachable connection. A second hollow column with a height less than that of the first hollow column may be mounted inside the first hollow column. A space between the first hollow column and the second hollow column and/or a space in the second hollow column may be filled with a substance used for heat preservation. For example, the space between the first hollow column and the second hollow column and the space in the second hollow column may be filled with the substance used for heat preservation. As another example, the space between the first hollow column and the second hollow column may be filled with the substance used for heat preservation, and the space in the second hollow column may not be filled with the substance. As a further example, the space between the first hollow column and the second hollow column may not be filled with the substance used for heat preservation, and the space in the second hollow column may be filled the substance used for heat preservation. The substance filled in the second hollow column may also be configured to support a crucible used for holding the reactants. In addition, an end of the second hollow column near the cover plate mounted on a top of the first hollow column may be connected with a heat preservation board to improve the heat preservation effect. In this case, the temperature field device described in the present disclosure may provide a reaction environment with good heat preservation performance, stable temperature field gradient, and good symmetry due to the hollow columns and the substance used for heat preservation which are beneficial to the crystal growth. More descriptions regarding the temperature field device may be found elsewhere in the present disclosure (e.g., FIGS. 2-5), which are not repeated herein.

In a third step, a flowing gas may be introduced into the crystal growth device after the crystal growth device is sealed. In some embodiments, the sealing of the crystal growth device may refer to that except for necessary contact, there is no gas exchange between the crystal growth device and the atmospheric environment. For example, a hearth of an open single-crystal growth furnace may be opened and an operator (e.g., a worker) may directly observe the temperature field device in the open single-crystal growth furnace, whereas, the temperature field device should be sealed and have no gas exchange with the atmospheric environment. As another example, an interior of a vacuum single-crystal growth furnace may be vacuum and the crystal growth device may have no gas exchange with the atmospheric environment. To realize the seal of the crystal growth device, a sealing ring, vacuum grease, and/or other sealing material may be mounted at joints among various components of the crystal growth device. It can be understood that a suitable protective gas may reduce volatilization of a reactant (e.g., gallium oxide) to a certain extent, thereby solving a problem of deviation of crystal components during the crystal growth. In some embodiments, the flowing gas may be introduced into the crystal growth device (e.g., the temperature field device) after the crystal growth device is sealed. The flowing gas may refer to a protective gas that enters from an inlet of the crystal growth device and flows out from an outlet of the crystal growth device. The flowing gas may include one or more of oxygen, carbon dioxide, and/or inert gas. It should be noted that the inert gas described in the present disclosure may include nitrogen. When the flowing gas is a mixed gas of oxygen and inert gas, a volume ratio of oxygen may be 0.001%~10%. Preferably, the volume ratio of oxygen may be 0.01%~10%. More preferably, the volume ratio of oxygen may be 0.1%~10%. More preferably, the volume ratio of oxygen may be 1%~10%. More preferably, the volume ratio of oxygen may be 2%~9%. More preferably, the volume ratio of oxygen may be 3%~8%. More preferably, the volume ratio of oxygen may be 4%~7%. More preferably, the volume ratio of oxygen may be 5%-6%. When the flowing gas is a mixed gas of carbon dioxide and inert gas, a volume ratio of carbon dioxide may be 0.001%~25%. Preferably, the volume ratio of carbon dioxide may be 0.01%~25%. More preferably, the volume ratio of carbon dioxide may be 0.1%~25%. More preferably, the volume ratio of carbon dioxide may be 1%~25%. More preferably, the volume ratio of carbon dioxide may be 2%~20%. More preferably, the volume ratio of carbon dioxide may be 3%~15%. More preferably, the volume ratio of carbon dioxide may be 4%~10%. More preferably, the volume ratio of carbon dioxide may be 5%~9%. More preferably, the volume ratio of carbon dioxide may be 6%~8%. In order to ensure that the flowing gas introduced does not affect the reactants (e.g., bringing in an impurity), a purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When the flowing gas is introduced to the crystal growth device, a flow rate of the flowing gas may be 0.01 L/min~50 L/min. Preferably, the flow rate of the flowing gas may be 0.1 L/min~50 L/min. More preferably, the flow rate of the flowing gas may be 1 L/min~50 L/min. More preferably, the flow rate of the flowing gas may be 5 L/min 45 L/min. More preferably, the flow rate of the flowing gas may be 10 L/min~40 L/min. More preferably, the flow rate of the flowing gas may be 15 L/min~35 L/min. More preferably, the flow rate of the flowing gas may be 20 L/min~30 L/min. More preferably, the flow rate of the flowing gas may be 21 L/min~29 L/min. More preferably, the flow rate of the flowing gas may be 22 L/min~28 L/min. More preferably, the flow rate of the flowing gas may be 23 L/min~27 L/min. More preferably, the flow rate of the flowing gas may be 24 L/min~26 L/min.

In a fourth step, the crystal growth device may be activated and the crystal growth may be executed based on a Czochralski technique. In some embodiments, the activating of the crystal growth device may include energizing and/or activating a cooling component. The reactants may be used for the crystal growth after being melted by heating. After being energized, a medium-frequency induction coil mounted in the single-crystal growth furnace may heat the crucible to melt the reactants in the crucible, In some embodiments, since a high temperature (e.g., 1900° C.) is required during the crystal growth, a plenty of heat radiation may be generated to the external environment. Further, since the crystal growth time length (e.g., 4 days~40 days) is relatively long, the heat radiation may affect the performance of the crystal growth device. Accordingly, the cooling component may be used to reduce the heat radiation. A cooling manner of the cooling component may include a liquid cooling mode, an air cooling mode or the like, or any combination thereof. For the liquid cooling mode, a cooling liquid may include water, ethanol, ethylene glycol, isopropanol, n-hexane, or the like, or any combination thereof. For example, the cooling liquid may include a 50:50 mixture of water and ethanol.

The Czochralski technique disclosed in the present disclosure may include a melting process, a seed crystal preheating process, a seeding process, a temperature adjustment process, a necking process, a shouldering process, a constant diameter growth process, an ending process, a cooling process, a crystal removing process, etc. The melting process may refer to a process during which the temperature may be increased to a certain value via a temperature increasing process, the reactants may be melted to form a melt, and a certain temperature (i.e., a temperature gradient) can be kept in the crystal growth device. The crucible in the crystal growth device may be used as a heater, and heat may be radiated from the crucible to the surroundings to form the temperature gradient in the crystal growth device. The temperature gradient may refer to a change rate of a temperature at a certain point toward a temperature of an adjacent point of the certain point in the crystal growth device, which may also be referred to as a change rate of the temperature per unit distance. Merely by way of example, a temperature change from a point M to a point N is $T_1-T_2$, and a distance between the two points is $(r_1-r_2)$, and the temperature gradient (denoted by $\Delta T$) from the point M to the point N may be represented as $(T_1-T_2)/(r_1-r_2)$, i.e., $\Delta T=T_1-T_2/r_1-r_2$. During the crystal growth, a suitable temperature gradient is needed. For example, during the crystal growth, a large enough temperature gradient $\Delta T$ along a vertical direction is needed, which can disperse the latent heat of crystallization generated during the crystal growth, thereby keeping the crystal growth stable. In some embodiments, a temperature of the melt below a growth interface should be higher than a crystallization temperature, so that a local growth of crystal would not be too fast and the growth interface would be stable, thereby keeping the growth stable. Keeping a suitable temperature gradient may be determined based on a location of a heating center.

The temperature gradient may be determined based on a location of the heating center during the melting process. In some embodiments, during the melting process, the reactants may be melted and then solidified to form a polycrystalline material. When a diameter of the polycrystalline material reaches 40 mm, the temperature increasing operation may be stopped. An upper limit of the temperature increasing may be determined according to a temperature or a heating power (e.g., a power of the induction coil) at a time when a screw rod started to be pulled up when the crystal growth device was used at the last time. For example, the heating power may be less than the heating power at the time when the pulling rod started to be pulled up at the last time by 300 W~500 W. A temperature increasing rate may be determined based on a temperature at which the pulling rod started to be pulled up at the last time. For example, the temperature increasing rate may be a ratio between the temperature at which the pulling rod started to be pulled up at the last time and a time length (e.g., 24 hours). After the temperature increasing operation is completed, the temperature may be maintained for 0.5 hours~1 hour. According to a melting condition of the reactants, the temperature may be continually increased or decreased.

The seed crystal preheating process may refer to a process during which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. During the seed crystal preheating process, a distance between the seed crystal and an upper surface of the reactants may be controlled. Preferably, the distance between the seed crystal and the upper surface of the reactants may be 5 mm~15 mm. Preferably, the distance between the seed crystal and the upper surface of the reactants may be 6 mm~14 mm. More preferably, the distance between the seed crystal and the upper surface of the reactants may be 7 mm~13 mm. More preferably, the distance between the seed crystal and the upper surface of the reactants may be 8 mm~12 mm. More preferably, the distance between the seed crystal and the upper surface of the reactants may be 9 mm~11 mm. In some embodiments, the seed crystal may include a YAG (yttrium aluminum garnet) seed crystal with a crystal orientation of [111] or [100]. A diameter of the seed crystal may be 4 mm~12 mm. Preferably, the diameter of the seed crystal may be 5 mm~11 mm. More preferably, the diameter of the seed crystal may be 6 mm~10 mm. More preferably, the diameter of the seed crystal may be 7 mm~9 mm.

The seeding process may refer to a process during which the pulling rod may be dropped to cause the seed crystal to contact with the melt after the reactants are melted to form a melt. The temperature adjustment process may refer to a process during which a temperature in the crystal growth device may be adjusted to a suitable temperature for the crystal growth. During the temperature adjustment process, the seed crystal may be sunk by 0.1 mm~50 mm. Preferably, the seed crystal may be sunk by 1 mm~50 mm. More preferably, the seed crystal may be sunk by 10 mm~40 mm. More preferably, the seed crystal may be sunk by 20 mm~30 mm. More preferably, the seed crystal may be sunk by 21 mm~29 mm. More preferably, the seed crystal may be sunk by 22 mm~28 mm. More preferably, the seed crystal may be sunk by 23 mm~27 mm. More preferably, the seed crystal may be sunk by 24 mm~26 mm. In some embodiments, a rate of the temperature adjustment may be 100 W/0.1 h~300 W/0.1 h. After the temperature adjustment process is completed, the temperature inside the crystal growth device may be maintained at 1900° C.~1930° C. for 20 minutes~60 minutes. Then, the screw rod may be rotated to pull the pulling rod up. After the seed crystal passes through a second cover plate and during the subsequent crystal growth, a rotation rate of the pulling rod may be 0.01 revolutions per minute (rpm)~35 rpm. Preferably, the rotation rate of the pulling rod may be 0.1 rpm~35 rpm. More preferably, the rotation rate of the pulling rod may be 1 rpm~35 rpm. More preferably, the rotation rate of the pulling rod may be 5 rpm~30 rpm. More preferably, the rotation rate of the pulling rod may be 10 rpm~25 rpm. More preferably, the rotation rate of the pulling rod may be 15 rpm~20 rpm.

The necking process may refer to a process during which the temperature may be slowly increased to cause a temperature of a zero point of the melt (i.e., a temperature of a center point of the liquid surface in crucible) to be slightly higher than the melting point of the crystal, and a diameter of a newly grown crystal during the rotation and pulling up of the seed crystal may be gradually decreased. The necking process may reduce the extension of crystal dislocations from the seed crystal to a single crystal below a neck. The shouldering process may refer to a process during which when atoms or molecules on a solid-liquid interface at a boundary between the seed crystal and the melt begin to be arranged in a structure of the seed crystal, the temperature in the temperature field may be slowly decreased to expand the seed crystal according to a preset angle according to a real-time growth rate of the crystal. In some embodiments, a shoulder angle may be 30 degrees~70 degrees. Preferably, the shoulder angle may be 40 degrees 60 degrees. More preferably, the shoulder angle may be 45 degrees~55 degrees. More preferably, the shoulder angle may be 46-54 degrees. More preferably, the shoulder angle may be 47 degrees~53 degrees. More preferably, the shoulder angle may be 48 degrees~52 degrees. More preferably, the shoulder angle may be 49 degrees~51 degrees. A shoulder length may be 40 mm~130 mm. Preferably, the shoulder length may be 50 mm~120 mm. More preferably, the shoulder length may be 60 mm~110 mm. More preferably, the shoulder length may be 70 mm~100 mm. More preferably, the shoulder length may be 80 mm~90 mm.

The constant diameter growth process may refer to a process during which a rod-like structure with a constant diameter that is determined during the shouldering process may be obtained. In some embodiments, a constant diameter of the crystal growth may be 10 mm~200 mm. Preferably, a length of the crystal during the constant diameter growth process may be 20 mm~180 mm. More preferably, the length of the crystal during the constant diameter growth process may be 50 mm~150 mm. More preferably, the length of the crystal during the constant diameter growth process may be 60 mm~140 mm. More preferably, the length of the crystal during the constant diameter growth process may be 70 mm~130 mm. More preferably, the length of the crystal during the constant diameter growth process may be 80 mm~120 mm. More preferably, the length of the crystal during the constant diameter growth process may be 90 mm~110 mm.

The ending process may refer to a process during which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod, or the diameter of the crystal may be reduced to a preset diameter (e.g., 10 mm). An automatic control program may be used to calculate a change of the diameter of the crystal based on predetermined parameter(s) of the ending process, and the crystal may be ended according to a preset angle by increasing or decreasing the temperature. In some embodiments, an ending angle may be 30 degrees~70 degrees. Preferably, the ending angle may be 40 degrees~60 degrees. More preferably, the ending angle may be 45 degrees~55 degrees. More preferably, the ending angle may be 46 degrees~54 degrees. More preferably, the ending angle may be 47 degrees~53 degrees. More preferably, the ending angle may be 48 degrees~52 degrees. More preferably, the ending angle may be 49 degrees~51 degrees. An ending length may be 40 mm~110 mm. Preferably, the ending length may be 50 mm~100 mm. More preferably, the ending length may be 60 mm~90 mm. More preferably, the ending length may be 70 mm~80 mm.

The cooling process may refer to a process during which a temperature may be slowly decreased after the ending process is completed to eliminate a stress within the crystal, which may be formed in the high-temperature crystal growth. The cooling process may prevent cracking of the crystal caused by a sudden drop of the temperature. In some embodiments, a cooling time length of the crystal may be 20 hours~100 hours. Preferably, the cooling time length of the crystal may be 30 hours~90 hours. More preferably, the cooling time length of the crystal may be 40 hours~80 hours. More preferably, the cooling time length of the crystal may be 50 hours~70 hours. More preferably, the cooling time length of the crystal may be 55 hours~65 hours. In some embodiments, assuming that T is the temperature after the ending process, a decreasing rate of the temperature of the crystal during the cooling process may be T/(20-100)h. In some embodiments, the decreasing rate of the temperature of the crystal may be 15° C./h~95° C./h. Preferably, the decreasing rate of the temperature of the crystal may be 20° C./h~65° C./h. More preferably, the decreasing rate of the temperature of the crystal may be 23° C./h~47° C./h. More preferably, the decreasing rate of the temperature of the crystal may be 26° C./h 38° C./h. More preferably, the decreasing rate of the temperature of the crystal may be 28° C./h~34° C./h. When an output heating power (e.g., the heating power of the induction coil) is 0, the crystal growth may end.

The crystal removing process may refer to a process during which the grown crystal may be taken out from the crystal growth device when an internal temperature of the crystal growth device drops to the room temperature. During the crystal growth, according to a setting of various process parameters in different stages of the crystal growth process, the growth rate of the crystal may be 0.01 mm/h~6 mm/h. Preferably, the growth rate of the crystal may be 0.1 mm/h~6 mm/h. More preferably, the growth rate of the crystal may be 1 mm/h~6 mm/h. More preferably, the growth rate of the crystal may be 2 mm/h~5 mm/h. More preferably, the growth rate of the crystal may be 3 mm/h~4 mm/h. A diameter of the obtained crystal may be 50 mm~110 mm. A diameter of a grown crystal may be equal to or greater than 60 mm, such as 60 mm~100 mm (e.g., 60 mm) or 70 mm~90 mm (e.g., 80 mm). The length of the grown crystal during the constant diameter growth process may reach more than 100 mm, such as 100 mm~200 mm, 100 mm~150 mm, or 150 mm~180 mm. The length of the grown crystal during the constant diameter growth process may reach more than 180 mm, such as 180 mm~500 mm, 180 mm~(400 mm, 300 mm, or 200 mm), (190 mm or 195 mm) (200 mm, 210 mm, 220 mm, or 230) mm, or 200 mm~300 mm.

In some embodiments, one or more processes in the crystal growth may be controlled by a PID (proportion, integral, differential) controller, including but not limited to the necking process, the shouldering process, the constant diameter growth process, the ending process, the cooling process, etc. In some embodiments, a PID parameter may be 0.1~~5. Preferably, the PID parameter may be 0.5~4.5. More preferably, the PID parameter may be 1~4. More preferably, the PID parameter may be 1.5~3.5. More preferably, the PID parameter may be 2~3. More preferably, the PID parameter may be 2.5~3.5.

It should be noted that the embodiments mentioned above regarding the crystal growth are only for explaining the technical solutions of the present disclosure and not limiting the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

FIG. 1 is a flowchart illustrating an exemplary process for growing a crystal according to some embodiments of the present disclosure. In some embodiments, the method for growing a crystal shown in process 100 may be implemented based on the Czochralski technique.

In 110, after a first preprocessing operation is performed on reactants, the reactants may be weighted based on a molar ratio of the reactants according to a reaction equation. Take a growth of Ce:GAGG crystal as an example, the reaction equation may be denoted as follows:

$$6yCeO_2+3(1-y)Gd_2O_3+5xAl_2O_3+5(1-x)Ga_2O_3 \rightarrow 2(Ce_yGd_{1-y})_3(Al_xGa_{1-x})_5O_{12}+O_2\uparrow.$$

It can be understood that a basic structure of the Ce:GAGG crystal to be grown is a garnet structure ($A_3B_5O_{12}$, A=Lu/Y/La/Gd/Yb, B=Al/Ga/In/Sc). Atoms occupying in B lattice are aluminum and gallium and trivalent cerium ions replace part of the gallium atoms to form the final crystal structure. In the above equation, x represents a proportion of aluminum atoms (Al) in the B lattice. y represents a doping concentration of the trivalent cerium ions ($Ce^{3+}$), that is, a proportion of $Ce^{3+}$ occupying atomic lattice of gadolinium (Gd). In some embodiments, a value of x may be 0.01%~50%. Preferably, the value of x may be 0.1%~50%. More preferably, the value of x may be 1%~50%. More preferably, the value of x may be 5%~45%. More preferably, the value of x may be 10%~40%. More preferably, the value of x may be 15%~35%. More preferably, the value of x may be 20%~30%. More preferably, the value of x may be 21%~29%. More preferably, the value of x may be 22%~28%. More preferably, the value of x may be 23%~27%. More preferably, the value of x may be 24%~26%. A value of y may be 0.001%~6%. Preferably, the value of y may be 0.01%~6%. More preferably, the value of y may be 0.1%~6%. More preferably, the value of y may be 0.3%~6%. More preferably, the value of y may be 1%~6%. More preferably, the value of y may be 2%~5%. More preferably, the value of y may be 3%~4%. More preferably, the value of y may be 3.1%~3.9%. More preferably, the value of y may be 3.2%~3.8%. More preferably, the value of y may be 3.3%~3.7%. More preferably, the value of y may be 3.4%~3.6%.

It should be understood that during the crystal growth, gallium oxide ($Ga_2O_3$) may volatilize under a heating condition, which may cause component deviation of the generated crystal, component difference among crystals generated in different times, and a poor growth repeatability. In the present disclosure, an excessive amount of gallium oxide may be used to avoid component deviation and poor growth repeatability caused by the volatilization of gallium oxide to a certain extent. In some embodiments, a weight of the gallium oxide may exceed 0.01%~10% of a weight of the gallium oxide determined according the reaction equation or a total weight of the reactants determined according to the reaction equation. Preferably, the weight of the gallium oxide may exceed 0.1%~10% of the weight of the gallium oxide determined according the reaction equation or the total weight of the reactants determined according to the reaction equation. More preferably, the weight of the gallium oxide may exceed 1%~10% the weight of the gallium oxide determined according the reaction equation or the total weight of the reactants determined according to the reaction equation. More preferably, the weight of the gallium oxide may exceed 2%~9% of the weight of the gallium oxide determined according the reaction equation or the total weight of the reactants determined according to the reaction equation. More preferably, the weight of the gallium oxide may exceed 3%~8% of the weight of the gallium oxide determined according the reaction equation or the total weight of the reactants determined according to the reaction equation. More preferably, the weight of the gallium oxide may exceed 4%~7% of the weight of the gallium oxide determined according the reaction equation or the total weight of the reactants determined according to the reaction equation. More preferably, the weight of the gallium oxide may exceed 5%~6% of the weight of the gallium oxide determined according the reaction equation or the total weight of the reactants determined according to the reaction equation.

Purity of each of the reactants may have a great influence on the scintillation performance of the crystal. In order to generate a crystal meeting requirements, the purity of each of the reactants for growing the crystal may be greater than 99%. More preferably, the purity of each of the reactants may be greater than 99.9%. More preferably, the purity of each of the reactants may be greater than 99.99%. More preferably, the purity of each of the reactants may be greater than 99.999%.

In some embodiments, the first preprocessing operation may include a high-temperature roasting operation. It can be understood that the high-temperature roasting operation may be performed on all the reactants to remove substances such as water and/or organic substance(s) of metal element(s) (e.g., cerium, gallium, aluminum, gadolinium) to improve the purity of the reactants. The roasting operation may be performed using a commercially available high-temperature roasting device such as a muffle furnace. In some embodiments, a roasting temperature of the reactants may be 800° C.~1400° C. More preferably, the roasting temperature of the reactants may be 900° C.~1300° C. More preferably, the roasting temperature of the reactants may be 1000°

C.~1200° C. More preferably, the roasting temperature of the reactants may be 1050° C.~1150° C. More preferably, the roasting temperature of the reactants may be 1060° C.~1140° C. More preferably, the roasting temperature of the reactants may be 1070° C.~1130° C. More preferably, the roasting temperature of the reactants may be 1080° C.~1120° C. More preferably, the roasting temperature of the reactants may be 1090° C.~1110° C. According to the characteristics of different reactants, a time length of the high-temperature roasting may be not less than 5 hours.

In 120, the reactants may be placed, on which a second preprocessing operation has been performed, into a crystal growth device. In some embodiments, the second preprocessing operation may include a room temperature mixing operation, a pressing operation, or the like, or any combination. It can be understood that uniformly mixed reactants may be conducive to the subsequent crystal growth. Exemplary mixing device may include but is not limited to a three-dimensional motion mixer, a double cone mixer, a vacuum mixer, a colter mixer, a V-type mixer, a conical twin-screw screw mixer, a planetary mixer, a horizontal screw mixer, etc. A mixing time length of the reactants may be 0.5 hours~48 hours. Preferably, the mixing time length may be 1 hours~48 hours. More preferably, the mixing time length may be 6 hours~42 hours. More preferably, the mixing time length may be 12 hours~36 hours. More preferably, the mixing time length may be 18 hours~30 hours. More preferably, the mixing time length may be 21 hours~27 hours.

The pressing operation may refer to an operation in which a certain pressure may be applied to the reactants to transform the reactants from a dispersed state into a body with an initial shape (e.g., a cylindrical shape). The pressed reactants may have a volume smaller than that of the reactants in the dispersed state, and may be easier to be put into a reaction device (e.g., a reaction crucible) in one time. In some embodiments, the pressing operation may discharge the air contained in the reactants in the dispersed state to reduce an impact of the air on the crystal growth in subsequent reactions. The pressing operation may be performed by an isostatic pressing device such as a cold isostatic pressing device. The reactants may be placed in a pressing tank and pressed into the body with the initial shape. A pressure used during the pressing operation may be 100 MPa~300 MPa. Preferably, the pressure used during the pressing operation may be 150 MPa~250 MPa. More preferably, the pressure used during the pressing operation may be 160 MPa~240 MPa. More preferably, the pressure used during the pressing operation may be 170 MPa~230 MPa. More preferably, the pressure used during the pressing operation may be 180 MPa~220 MPa. More preferably, the pressure used during the pressing operation may be 190 MPa~210 MPa. More preferably, the pressure used during the pressing operation may be 200 MPa.

In some embodiments, the crystal growth device may include a single-crystal growth furnace and a temperature field device. A type of the single-crystal growth furnace may include an open type or a vacuum type, which is not limited in the present disclosure. The temperature field device may be used in the single-crystal growth furnace to provide a temperature gradient for the crystal growth and ensure the stability of a crystallization process of the crystal. A temperature field with good symmetry and stability may avoid problems of cracking and abnormal growth during the crystal growth. The temperature field device may include a first hollow column and two cover plates covering two ends of the first hollow column, respectively. Specifically, the two cover plates may be connected to the two ends of the first hollow column. The connection may include a bonding connection, a welding connection, a riveting connection, a key connection, a bolt connection, a buckle connection, or the like, or any combination thereof. Alternatively, a first end of the two ends of the first hollow column may be connected to one cover plate of the two cover plates (e.g., via a detachable connection), and a second end of the two ends of the first hollow column may be integrally formed with the other cover plate, or connected to the other cover plate via a non-detachable connection. A second hollow column with a height less than that of the first hollow column may be mounted inside the first hollow column. A space between the first hollow column and the second hollow column and/or a space in the second hollow column may be filled with a substance used for heat preservation. For example, the space between the first hollow column and the second hollow column and the space in the second hollow column may be filled with a substance used for preservation. As another example, the space between the first hollow column and the second hollow column may be filled with a substance used for heat preservation, and the space in the second hollow column may not be filled with the substance. As a further example, the space between the first hollow column and the second hollow column may not be filled with a substance, and the space in the second hollow column may be filled with the substance used for heat preservation. The substance filled in the second hollow column may also be configured to support a crucible used for holding the reactants. In addition, an end of the second hollow column near the cover plate mounted on a top of the first hollow column may be connected with a heat preservation board to further improve the heat preservation effect. In this case, the temperature field device described in the present disclosure may provide a reaction environment with good heat preservation performance, stable temperature field gradient, and good symmetry due to the hollow columns and the substance used for heat preservation, which may be beneficial to the crystal growth. More descriptions regarding the temperature field device may be found elsewhere in the present disclosure (e.g., FIGS. 2-5), which are not repeated herein.

In 130, a flowing gas may be introduced into the crystal growth device after the crystal growth device is sealed. In some embodiments, the sealing of the crystal growth device may refer to that except for necessary contact, there is no gas exchange between the crystal growth device and the atmospheric environment. For example, a hearth of an open single-crystal growth furnace may be opened and an operator (e.g., a worker) may directly observe the temperature field device in the open single-crystal growth furnace, whereas, the temperature field device should be sealed and have no gas exchange with the atmospheric environment. As another example, an interior of a vacuum type single-crystal growth furnace may be vacuum, and the crystal growth device may have no gas exchange with the atmospheric environment. To realize the seal of the crystal growth device, a sealing ring, vacuum grease, and/or other sealing material may be mounted at joints among various components of the crystal growth device. It can be understood that a suitable protective gas may reduce volatilization of a reactant (e.g., gallium oxide) to a certain extent, thereby solving a problem of deviation of crystal components during the crystal growth. In some embodiments, the flowing gas may be introduced into the crystal growth device (e.g., the temperature field device) after the crystal growth device is sealed. The flowing gas may refer to a protective gas that enters from an inlet of the crystal growth device and flows out from an outlet of the crystal growth device. The flowing gas may include one or more of oxygen and/or inert gas. It should be noted that the inert gases described in the present disclosure may include nitrogen. When the flowing gas is a mixed gas of oxygen and one or more inert gases, a volume ratio of oxygen may be 0.001%~10%. Preferably, the volume ratio of oxygen may be 0.01%~10%. More preferably, the volume ratio of oxygen may be 0.1%~10%. More preferably, the volume ratio of oxygen may be 1%~10%. More preferably, the volume ratio of oxygen may be 2%~9%. More preferably, the volume ratio of oxygen may be 3%~8%. More preferably, the volume ratio of oxygen may be 4%~7%. More preferably, the volume ratio of oxygen may be 5%~6%. When the flowing gas is a mixed gas of carbon dioxide and one or more inert gases, a volume ratio of carbon dioxide may be 0.001%~25%. Preferably, the volume ratio of carbon dioxide may be 0.01%~25%. More preferably, the volume ratio of carbon dioxide may be 0.1%~25%. More preferably, the volume ratio of carbon dioxide may be 1%~25%. More preferably, the volume ratio of carbon dioxide may be 2%~20%. More preferably, the volume ratio of carbon dioxide may be 3%~15%. More preferably, the volume ratio of carbon dioxide may be 4%~10%. More preferably, the volume ratio of carbon dioxide may be 5%~9%. More preferably, the volume ratio of carbon dioxide may be 6%-8%. In order to ensure that the flowing gas introduced may not affect the reactants (e.g., bringing in an impurity), a purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When the flowing gas is introduced into the crystal growth device, a flow rate of the flowing gas may be 0.01 L/min~50 L/min. Preferably, the flow rate of the flowing gas may be 0.1 L/min~50 L/min. More preferably, the flow rate of the flowing gas may be 1 L/min~50 L/min. More preferably, the flow rate of the flowing gas may be 5 L/min 45 L/min. More preferably, the flow rate of the flowing gas may be 10 L/min~40 L/min. More preferably, the flow rate of the flowing gas may be 15 L/min~35 L/min. More preferably, the flow rate of the flowing gas may be 20 L/min~30 L/min. More preferably, the flow rate of the flowing gas may be 21 L/min~29 L/min. More preferably, the flow rate of the flowing gas may be 22 L/min~28 L/min. More preferably, the flow rate of the flowing gas may be 23 L/min~27 L/min. More preferably, the flow rate of the flowing gas may be 24 L/min~26 L/min.

In 140, the crystal growth device may be activated to grow the crystal based on the Czochralski technique. In some embodiments, the activation of the crystal growth device may include energizing, and/or activating a cooling component. The reactants may be used for the crystal growth after being melted by heating. A medium-frequency induction coil in the single-crystal growth furnace may be energized and heat the crucible to melt the reactants in the crucible. In some embodiments, since a high temperature (e.g., 1900° C.) is required during the crystal growth, a plenty of heat radiation may be generated to the external environment. Further, since the crystal growth time length (e.g., 4 days~40 days) is relatively long, the heat radiation may affect the performance of the crystal growth device. Accordingly, the cooling component may be used to reduce the heat radiation. A cooling manner of the cooling component may include a liquid cooling mode, an air cooling mode, an air cooling mode, or the like, or any combination thereof. For the liquid cooling mode, a cooling liquid may include water, ethanol, ethylene glycol, isopropanol, n-hexane, or the like, or any combination thereof. For example, the cooling liquid may include a 50:50 mixture of water and ethanol.

The Czochralski technique disclosed in the present disclosure may include a melting process, a seed crystal preheating process, a seeding process, a temperature adjustment process, a necking process, a shouldering process, a constant diameter growth process, an ending process, a cooling process, a crystal removing process, or the like. The melting process may refer to a process during which the temperature may be increased to a certain value via a temperature increasing process, the reactants may be melted to form a melt, and a certain temperature (i.e., a temperature gradient) can be kept in the crystal growth device. The crucible in the crystal growth device may be used as a heater, and heat may be radiated from the crucible to the surroundings to form the temperature gradient in the crystal growth device. The temperature gradient may refer to a change rate of a temperature at a certain point toward a temperature of an adjacent point of the certain point in the crystal growth device, which may also be referred to as a change rate of the temperature per unit distance. Merely by way example, a temperature change from a point M to a point N is $(T_1-T_2)$, and a distance between the two points is $(r_1-r_2)$, and the temperature gradient (denoted by $\Delta T$) from the point M to the point N may be represented as $(T_1-T_2)/(r_1-r_2)$, i.e., $\Delta T=T_1-T_2/r_1-r_2$. During the crystal growth, a suitable temperature gradient is needed. For example, during the crystal growth, a large enough temperature gradient $\Delta T$ along a vertical direction is needed, which can disperse the latent heat of crystallization generated during the crystal growth, thereby keeping the crystal growth stable. In some embodiments, a temperature of the melt below a growth interface should be higher than a crystallization temperature, so that a local growth of the crystal would not be too fast and the growth interface would be stable, thereby keeping the growth stable.

Keeping a suitable temperature gradient may be determined based on a location of a heating center. The temperature gradient may be determined based on a location of a heating center during the melting process. In some embodiments, during the melting process, the reactants may be melted and then solidified to form a polycrystalline material. When a diameter of the polycrystalline material reaches 40 mm, the temperature increasing operation may be stopped. An upper limit of the temperature increasing may be determined according to a temperature or a heating power (e.g., a power of the induction coil) at a time when a screw rod started to be pulled up when the crystal growth device was used at the last time. For example, the heating power may be less than the heating power at the time when the pulling rod started to be pulled up at the last time by 300 W~500 W. A temperature increasing rate may be determined based on a temperature at which the pulling rod started to be pulled up at the last time. For example, the temperature increasing rate may be a ratio between the temperature at which the pulling rod started to be pulled up at the last time and a time length (e.g., 24 hours). After temperature increasing operation is completed, the temperature may be maintained for 0.5 hours~1 hour. According to a melting condition of the reactants, the temperature may be continually increased or decreased.

The seed crystal preheating process may refer to a process during which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. During the seed crystal preheating process, a distance between the seed crystal and an upper surface of the reactants may be 5 mm~15 mm. Preferably, the distance between the seed crystal and the upper surface of the reactants may be 6 mm~14 mm. More preferably, the distance between the seed crystal and the upper surface of the reactants may be 7 mm~13 mm. More preferably, the distance between the seed crystal and the upper surface of the reactants may be 8 mm~12 mm. More preferably, the distance between the seed crystal and the upper surface of the reactants may be 9 mm~11 mm. In some embodiments, the seed crystal may include a YAG (yttrium aluminum garnet) seed crystal with a crystal orientation of [111] or [100]. A diameter of the seed crystal may be 4 mm~12 mm. Preferably, the diameter of the seed crystal may be 5 mm~11 mm. More preferably, the diameter of the seed crystal may be 6 mm~10 mm. More preferably, the diameter of the seed crystal may be 7 mm~9 mm.

The seeding process may refer to a process during which after the reactants are melted to form a melt, the pulling rod may be dropped to cause the seed crystal to contacting with the melt. The temperature adjustment process may refer to a process during which a temperature in the crystal growth device may be adjusted to a suitable temperature for the crystal growth. During the temperature adjustment process, the seed crystal may be sunk by 0.1 mm~500 mm. Preferably, the seed crystal may be sunk by 1 mm~500 mm. More preferably, the seed crystal may be sunk by 10 mm~40 mm. More preferably, the seed crystal may be sunk by 20 mm~30 mm. More preferably, the seed crystal may be sunk by 21 mm~29 mm. More preferably, the seed crystal may be sunk by 22 mm~28 mm. More preferably, the seed crystal may be sunk by 23 mm~27 mm. More preferably, the seed crystal may be sunk by 24 mm~26 mm. In some embodiments, a rate of the temperature adjustment may be 100 W/0.1 h~300 W/0.1 h. After the temperature adjustment process is completed, the temperature inside the crystal growth device may be kept at 1900° C.~1930° C. for 20 minutes~60 minutes. Then, the screw rod may be rotated to pull the pulling rod up. After the seed crystal passes through a second cover plate and during the subsequent crystal growth, a rotation rate of the pulling rod may be 0.01 rpm~35 rpm. Preferably, the rotation rate of the pulling rod may be 0.1 rpm~35 rpm. More preferably, the rotation rate of the pulling rod may be 1 rpm~35 rpm. More preferably, the rotation rate of the pulling rod may be 5 rpm~30 rpm. More preferably, the rotation rate of the pulling rod may be 10 rpm 25 rpm. More preferably, the rotation rate of the pulling rod may be 15 rpm~20 rpm.

The necking process may refer to a process during which the temperature may be slowly increased to cause a temperature of a zero point of the melt (i.e., a temperature of a center point of the liquid surface in crucible) to be slightly higher than the melting point of the crystal, and a diameter of a newly grown crystal during the rotation and pulling up of the seed crystal may be gradually decreased. The necking process may reduce the extension of crystal dislocations from the seed crystal to a single crystal below a neck. The shouldering processing may refer to a process during which when atoms or molecules on a solid-liquid interface at a boundary between the seed crystal and the melt begin to be arranged in a structure of the seed crystal, the temperature in the temperature field may be slowly decreased according to a real-time growth rate of the crystal to expand the seed crystal according to a preset angle. In some embodiments, a shoulder angle may be 30 degrees~70 degrees. Preferably, the shoulder angle may be 40 degrees~60 degrees. More preferably, the shoulder angle may be 45 degrees~55 degrees. More preferably, the shoulder angle may be 46-54 degrees. More preferably, the shoulder angle may be 47 degrees~53 degrees. More preferably, the shoulder angle may be 48 degrees~52 degrees. More preferably, the shoulder angle may be 49 degrees~51 degrees. A shoulder length may be 40 mm~130 mm. Preferably, the shoulder length may be 50 mm~120 mm. More preferably, the shoulder length may be 60 mm~110 mm. More preferably, the shoulder length may be 70 mm~100 mm. More preferably, the shoulder length may be 80 mm~90 mm.

The constant diameter growth process may refer to a process during which a rod-like structure with a constant diameter which is determined during the shouldering process may be obtained. In some embodiments, a length of the crystal during the constant diameter growth process may be 10 mm~200 mm. Preferably, the length of the crystal during the constant diameter growth process may be 20 mm~180 mm. More preferably, the length of the crystal during the constant diameter growth process may be 50 mm~150 mm. More preferably, the length of the crystal during the constant diameter growth process may be 60 mm~140 mm. More preferably, the length of the crystal during the constant diameter growth process may be 70 mm~130 mm. More preferably, the length of the crystal during the constant diameter growth process may be 80 mm~120 mm. More preferably, the length of the crystal during the constant diameter growth process may be 90 mm~110 mm.

The ending process may refer to a process during which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod, or the diameter of the crystal may be reduced to a preset diameter (e.g., 10 mm). An automatic control program may be used to determine a change of the diameter of the crystal based on predetermined parameter(s) of the ending process, and perform the ending process according to a preset angle by increasing or decreasing the temperature. In some embodiments, an ending angle may be 30 degrees~70 degrees. Preferably, an ending angle may be 40 degrees~60 degrees. More preferably, the ending angle may be 45 degrees~55 degrees. More preferably, the ending angle may be 46 degrees~54 degrees. More preferably, the ending angle may be 47 degrees~53 degrees. More preferably, the ending angle may be 48 degrees~52 degrees. More preferably, the ending angle may be 49 degrees~51 degrees. An ending length of the crystal may be 40 mm~110 mm. More preferably, the ending length of the crystal may be 50 mm~100 mm. More preferably, the ending length of the crystal may be 60 mm~90 mm. More preferably, the ending length of the crystal may be 70 mm~80 mm.

The cooling process may refer to a process during which a temperature may be slowly decreased after the ending process is completed to eliminate a stress within the crystal, which may be formed in the high-temperature crystal growth. The cooling process may prevent cracking of the crystal caused by a sudden drop of the temperature. In some embodiments, a cooling time length of the crystal may be 20 hours~100 hours. Preferably, the cooling time length of the crystal may be 30 hours~90 hours. More preferably, the cooling time length of the crystal may be 40 hours~80 hours. More preferably, the cooling time length of the crystal may be 50 hours~70 hours. More preferably, the cooling time length of the crystal may be 55 hours~65 hours. In some embodiments, assuming that T is the temperature after the ending process, a decreasing rate of a temperature of the crystal during the cooling process may be T/(20-100)$h$. In some embodiments, the decreasing rate of the temperature of the crystal may be 15° C./h~95° C./h. Preferably, the decreasing rate of the temperature of the crystal may be 20° C./h~65° C./h. More preferably, the decreasing rate of the temperature of the crystal may be 23° C./h~47° C./h. More preferably, the decreasing rate of the temperature of the crystal may be 26° C./h 38° C./h. More preferably, the decreasing rate of the temperature of the crystal may be 28° C./h~34° C./h. When an output heating power (e.g., the heating power of the induction coil) is 0, the crystal growth may end.

The crystal removing process may refer to a process during which the grown crystal may be taken out from the crystal growth device when an internal temperature of the crystal growth device drops to the room temperature. During the crystal growth, according to a setting of various process parameters in different stages of the crystal growth process, the growth rate of the crystal may be 0.01 mm/h~6 mm/h. Preferably, the growth rate of the crystal may be 0.1 mm/h~6 mm/h. More preferably, the growth rate of the crystal may be 0.1 mm/h~6 mm/h. More preferably, the growth rate of the crystal may be 2 mm/h~5 mm/h. More preferably, the growth rate of the crystal may be 3 mm/h~4 mm/h. A diameter of an obtained crystal may be 50 mm~110 mm. A diameter of a grown crystal may be equal to or greater than 60 mm, such as 60 mm~100 mm (e.g., 60 mm) or 70 mm~90 mm (e.g., 80 mm). The length of the grown crystal during the constant diameter growth process may reach more than 100 mm, such as 100 mm~200 mm, 100 mm~150 mm, or 150 mm~180 mm. The length of the grown crystal during the constant diameter growth process may reach more than 180 mm, such as 180 mm~500 mm, 180 mm~(400 mm, 300 mm, or 200 mm), (190 mm or 195 mm) (200 mm, 210 mm, 220 mm, or 230) mm, or 200 mm~300 mm.

In some embodiments, one or more processes in the crystal growth may be controlled by a PID controller. The one or more processed may include but not limited to the necking process, the shouldering process, the constant diameter growth process, the ending process, the cooling process, etc. In some embodiments, the PID parameter may be 0.1~5. Preferably, the PID parameter may be 0.5~4.5. More preferably, the PID parameter may be 1~4. More preferably, the PID parameter may be 1.5~3.5. More preferably, the PID parameter may be 2~3. More preferably, the PID parameter may be 2.5~3.5.

It should be noted that the embodiments mentioned above are only used to illustrate the technical solutions of the present disclosure but not to limit the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

Figure 2:
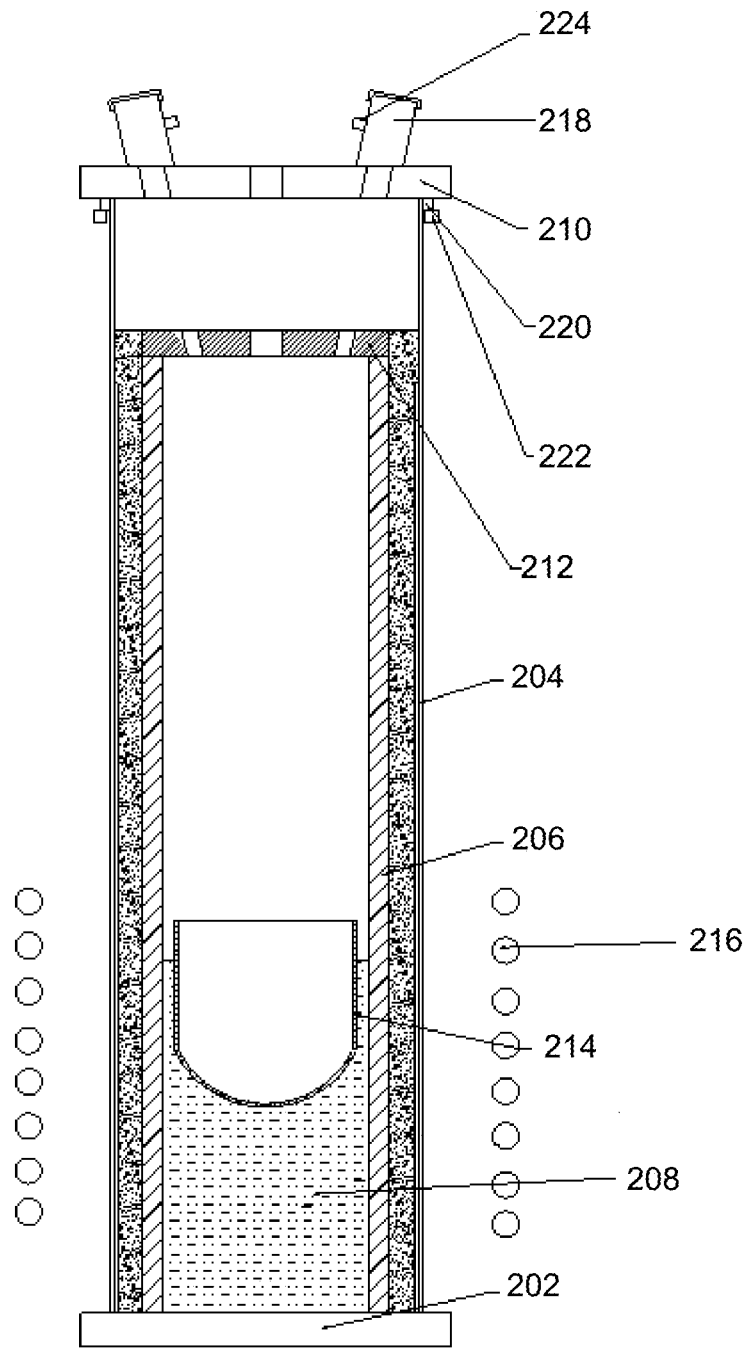
FIG. 2 is a schematic diagram illustrating an exemplary temperature field device according to some embodiments of the present disclosure.

FIG. 2 is a schematic diagram illustrating a temperature field device 200 according to some embodiments of the present disclosure. It should be noted that FIG. 2 is provided for illustration purposes, and does not limit the shape and structure of the temperature field device. The temperature field device 200 may be placed in a crystal growth device to provide a temperature gradient for crystal growth and ensure the stability of a crystallization process of the crystal. As shown in FIG. 2, the temperature field device 200 may include a bottom plate 202, a first drum 204, a second drum 206, a filler 208, a first cover plate 210, a second cover plate 212, an observation unit 218, a sealing ring 220, a pressure ring 222, and a gas channel 224. When in use, the temperature field device 200 may be placed in a crystal growth device (e.g., a single-crystal growth furnace). For example, the temperature field device 200 may be placed in an induction coil 216 in the growth furnace. A crucible 214 may be placed inside the temperature field device 200.

The bottom plate 202 may be mounted on a bottom of the temperature field device 200 to support other components of the temperature field device 200, for example, the first drum 204, the second drum 206, the filler 208, etc. In some embodiments, a material of the bottom plate 202 may include a heat-reflective material with a relatively high reflection coefficient, e.g., gold, silver, nickel, aluminum foil, copper, molybdenum, coated metal, stainless steel, or the like, or any combination thereof. Preferably, the bottom plate 202 may include a copper plate. In some embodiments, a diameter of the bottom plate 202 may be 200 mm~500 mm. Preferably, the diameter of the bottom plate 202 may be 250 mm~450 mm. More preferably, the diameter of the bottom plate 202 may be 300 mm~400 mm. More preferably, the diameter of the bottom plate 202 may be 310 mm~390 mm. More preferably, the diameter of the bottom plate 202 may be 320 mm~380 mm. More preferably, the diameter of the bottom plate 202 may be 430 mm~370 mm. More preferably, the diameter of the bottom plate 202 may be 440 mm~360 mm. In some embodiments, a thickness of the bottom plate 202 may be 10 mm~40 mm. Preferably, the thickness of the bottom plate 202 may be 15 mm~35 mm. More preferably, the thickness of the bottom plate 202 may be 20 mm~30 mm. More preferably, the thickness of the bottom plate 202 may be 21 mm~29 mm. More preferably, the thickness of the bottom plate 202 may be 22 mm~28 mm. More preferably, the thickness of the bottom plate 202 may be 23 mm~27 mm. More preferably, the thickness of the bottom plate 202 may be 24 mm~26 mm. Since the temperature field device 200 may be placed in a furnace body of the single-crystal growth furnace when the temperature field device 200 is in use, the bottom plate 202 may be placed or mounted on a mounting plate of the furnace body. A mode of placing or mounting the bottom plate 202 may include a welding connection, a riveting connection, a bolt connection, a bonding connection, or the like, or any combination thereof. When the bottom plate 202 is being mounted, a level requirement of the bottom plate 202 may be less than 0.5 mm/m. Preferably, the level requirement of the bottom plate 202 is less than 0.4 mm/m. More preferably, the level requirement of the bottom plate 202 may be less than 0.3 mm/m. More preferably, the level requirement of the bottom plate 202 may be less than 0.2 mm/m. More preferably, the level requirement of the bottom plate 202 may be less than 0.1 mm/m. More preferably, the level requirement of the bottom plate 202 may be less than 0.09 mm/m. More preferably, the level requirement of the bottom plate 202 may be less than 0.08 mm/m. More preferably, the level requirement of the bottom plate 202 may be less than 0.07 mm/m. More preferably, the level requirement of the bottom plate 202 may be less than 0.06 mm/m. More preferably, the level requirement of the bottom plate 202 may be less than 0.05 mm/m. More preferably, the level requirement of the bottom plate 202 may be less than 0.04 mm/m. More preferably, the level requirement of the bottom plate 202 may be less than 0.03 mm/m. More preferably, the level requirement of the bottom plate 202 may be less than 0.02 mm/m. More preferably, the level requirement of the bottom plate 202 may be less than 0.01 mm/m. When the temperature field device 200 is in use, an internal temperature may reach a relatively high temperature, for example, 1900° C. Therefore, it is necessary to reduce heat radiation of the temperature field device 200 to prevent the furnace body from being damaged by excessive heat. In this case, the bottom plate 202 may be provided with circulating cooling liquid channel(s), through which circulating cooling liquid may pass to absorb the heat inside the temperature field device 200, thereby insulating the heat and reducing the heat radiation. The circulating cooling liquid channel(s) may be mounted inside the bottom plate 202 with a spiral shape or a snake shape. The cooling liquid may include water, ethanol, ethylene glycol, isopropanol, n-hexane, or the like, or any combination thereof. For example, the cooling liquid may include a 50:50 mixed liquid of water and ethanol. A count (or number) of the circulating cooling channel(s) may be one or more, for example, 1~3. In some embodiments, diameter(s) of the circulating cooling liquid channel(s) may be 5 mm~25 mm. Preferably, the diameter(s) of the circulating cooling liquid channel(s) may be 10 mm~20 mm. Preferably, the diameter(s) of the circulating cooling liquid channel(s) may be 11 mm~19 mm. Preferably, the diameter(s) of the circulating cooling liquid channel(s) may be 12 mm~18 mm. Preferably, the diameter(s) of the circulating cooling liquid channel(s) may be 13 mm~17 mm. Preferably, diameter(s) of the circulating cooling liquid channel(s) may be 14 mm~15 mm.

The first drum 204 may be mounted on the bottom plate 202 and constitute an outer wall of the temperature field device 200. The bottom plate 202 may cover an open end of the first drum 204. The first drum 204 may be mounted on the bottom plate 202 via a welding connection, a riveting connection, a bolt connection, a bonding connection, or the like, or any combination thereof, to support the temperature field device 200. In some embodiments, the first drum 204 may be used to achieve the sealing and the heat preservation of the temperature field device 200 together with other components of the temperature field device 200, such as the bottom plate 202, the first cover plate 210, etc. When the first drum 204 is being mounted, a concentricity of the first drum 204 and the bottom plate 202 may be less than 1 mm. Preferably, the concentricity of the first drum 204 and the bottom plate 202 may be less than 0.9 mm. More preferably, the concentricity of the first drum 204 and the bottom plate 202 may be less than 0.8 mm. More preferably, the concentricity of the first drum 204 and the bottom plate 202 may be less than 0.7 mm. More preferably, the concentricity of the first drum 204 and the bottom plate 202 may be less than 0.6 mm. More preferably, the concentricity of the first drum 204 and the bottom plate 202 may be less than 0.5 mm. More preferably, the concentricity of the first drum 204 and the bottom plate 202 may be less than 0.4 mm. More preferably, the concentricity of the first drum 204 and the bottom plate 202 may be less than 0.3 mm. More preferably, the concentricity of the first drum 204 and the bottom plate 202 may be less than 0.2 mm. More preferably, the concentricity of the first drum 204 and the bottom plate 202 may be less than 0.1 mm. A perpendicularity between the first drum 204 and the bottom plate 202 may be less than 0.2 degrees. Preferably, the perpendicularity between the first drum 204 and the bottom plate 202 may be less than 0.15 degrees. More preferably, the perpendicularity between the first drum 204 and the bottom plate 202 may be less than 0.1 degrees. More preferably, the perpendicularity between the first drum 204 and the bottom plate 202 may be less than 0.05 degrees. More preferably, the perpendicularity between the first drum 204 and the bottom plate 202 may be less than 0.03 degrees. In some embodiments, the first drum 204 may be made of quartz, corundum, alumina, zirconium oxide, graphite, carbon fiber, etc. According to a size of the bottom plate 202, an inner diameter of the first drum 204 may be 180 mm~450 mm. Preferably, the inner diameter of the first drum 204 may be 200-530 mm. More preferably, the inner diameter of the first drum 204 may be 220 mm~510 mm. More preferably, the inner diameter of the first drum 204 may be 250 mm~380 mm. More preferably, the inner diameter of the first drum 204 may be 270 mm~360 mm. More preferably, the inner diameter of the first drum 204 may be 300 mm~330 mm. More preferably, the inner diameter of the first drum 204 may be 310 mm~320 mm. In some embodiments, a thickness of the first drum 204 may be 1 mm~15 mm. Preferably, the thickness of the first drum 204 may be 3 mm~12 mm. More preferably, the thickness of the first drum 204 may be 5 mm~10 mm. More preferably, the thickness of the first drum 204 may be 6 mm~9 mm. More preferably, the thickness of the first drum 204 may be 7 mm~8 mm. A height of the first drum 204 may be 600 mm~1600 mm. Preferably, the height of the first drum 204 may be 700 mm~1500 mm. More preferably, the height of the first drum 204 may be 800 mm~1400 mm. More preferably, the height of the first drum 204 may be 900 mm~1300 mm. More preferably, the height of the first drum 204 may be 1000 mm~1200 mm. More preferably, the height of the first drum 204 may be 1050 mm~1150 mm. More preferably, the height of the first drum 204 may be 1060 mm~1140 mm. More preferably, the height of the first drum 204 may be 1070 mm~1130 mm. More preferably, the height of the first drum 204 may be 1080 mm~1120 mm. More preferably, the height of the first drum 204 may be 1090 mm~1110 mm. More preferably, the height of the first drum 204 may be 1095 mm~1105 mm. The second drum 206 may be mounted in the first drum 204.

In some embodiments, the second drum 206 may be made of a material with relatively good heat resistance to maintain a temperature of the crystal growth stable. The second drum 206 may be made of zirconia, alumina, graphite, ceramics, etc. Preferably, the second drum 206 may include a zirconium tube made of zircona. In order to match the size of the first drum 204, an inner diameter of the second drum 206 may be 70 mm~300 mm. Preferably, the inner diameter of the second drum 206 may be 100 mm~270 mm. More preferably, the inner diameter of the second drum 206 may be 120 mm~250 mm. More preferably, the inner diameter of the second drum 206 may be 150 mm~220 mm. More preferably, the inner diameter of the second drum 206 may be 170 mm~200 mm. More preferably, the inner diameter of the second drum 206 may be 180 mm~270 mm. A thickness of the second drum 206 may be 8 mm~30 mm. Preferably, the thickness of the second drum 206 may be 10 mm~30 mm. More preferably, the thickness of the second drum 206 may be 15 mm~25 mm. More preferably, the thickness of the second drum 206 may be 16 mm~24 mm. More preferably, the thickness of the second drum 206 may be 17 mm~23 mm. More preferably, the thickness of the second drum 206 may be 18 mm~22 mm. More preferably, the thickness of the second drum 206 may be 19 mm~21 mm. In some embodiments, one end of the second drum 206 may be placed or mounted on the bottom plate 202, for example, via a bonding connection, a welding connection, a riveting connection, a key connection, a bolt connection, a buckle connection, or the like, or any combination thereof. When the second drum 206 is being mounted, a concentricity of the second drum 206 and the bottom plate 202 may be less than 1 mm. Preferably, the concentricity of the second drum 206 and the bottom plate 202 may be less than 0.9 mm. More preferably, the concentricity of the second drum 206 and the bottom plate 202 may be less than 0.8 mm. More preferably, the concentricity of the second drum 206 and the bottom plate 202 may be less than 0.7 mm. More preferably, the concentricity of the second drum 206 and the bottom plate 202 may be less than 0.6 mm. More preferably, the concentricity of the second drum 206 and the bottom plate 202 may be less than 0.5 mm. More preferably, the concentricity of the second drum 206 and the bottom plate 202 may be less than 0.4 mm. More preferably, the concentricity of the second drum 206 and the bottom plate 202 may be less than 0.3 mm. More preferably, the concentricity of the second drum 206 and the bottom plate 202 may be less than 0.2 mm. More preferably, the concentricity of the second drum 206 and the bottom plate 202 may be less than 0.1 mm. More preferably, the concentricity of the second drum 206 and the bottom plate 202 may be less than 0.05 mm. In some embodiments, a perpendicularity of the second drum 206 may be less than 0.2 degrees. Preferably, the perpendicularity of the second drum 206 may be less than 0.15 degrees. More preferably, the perpendicularity of the second drum 206 may be less than 0.1 degrees. More preferably, the perpendicularity of the second drum 206 may be less than 0.08 degrees. More preferably, the perpendicularity of the second drum 206 may be less than 0.05 degrees. When the second drum 206 is mounted on the bottom plate 202, the second drum 206 may be in different mounting states according to different lengths of the second drum 206. When a length of the second drum 206 is consistent with that of the first drum 204, a mounting state of the second drum 206 may be similar to that of the first drum 204. That is, one open end of the second drum 206 may be connected to the bottom plate 202 and the other open end of the second drum 206 may be connected to the first cover plate 210. When the length of the second drum 206 is less than that of the first drum 204, the other open end of the second drum 206 may be connected to other components (e.g., the second cover plate 212) of the temperature field device 200 and the second cover plate 212 may cover the other open end of the second drum 206. In some embodiments, a size and/or a shape (e.g., a diameter of a circle cover plate) of the second cover plate 212 may match a cross-section of the first drum 204 to achieve a seamless connection with the first drum 204. In some embodiments, the second drum 206 may not be mounted on the bottom plate 202. When the length of the second drum 206 is smaller than that of the first drum 204, an end of the second drum 206 may be mounted on other components (e.g., the first cover plate 210, the second cover plate 212) of the temperature field device 200 and the other end of the second drum 206 may be kept at a certain distance from the bottom plate 202 (e.g., in a floating state). In some embodiments, the length of the second drum 206 may be consistent with that of the first drum 204. In some embodiments, the length of the second drum 206 may be 500 mm~1500 mm. Preferably, the length of the second drum 206 may be 600 mm~1400 mm. More preferably, the length of the second drum 206 may be 700 mm~1300 mm. More preferably, the length of the second drum 206 may be 800 mm~1200 mm. More preferably, the length of the second drum 206 may be 900 mm~1100 mm. More preferably, the length of the second drum 206 may be 950 mm~1050 mm. More preferably, the length of the second drum 206 may be 960 mm~1040 mm. More preferably, the length of the second drum 206 may be 970 mm~1030 mm. More preferably, the length of the second drum 206 may be 980 mm~1020 mm. More preferably, the length of the second drum 206 may be 990 mm~1010 mm.

The filler 208 may be filled in the second drum 206 and/or a space between the first drum 204 and the second drum 206. The filler 208 may be configured for heat preservation. In some embodiments, a height and/or a tightness of the filler 208 may change a position of a component (e.g., the crucible 214) supported by the filler 208 and/or a space volume of the heat dissipation in the temperature field device 200. Different stable temperature gradients for different crystal growths may be obtained by changing the height and/or the tightness of the filler 208. The height of the filler 208 may determine a location of a heating center, which may affect the temperature gradient above a melt interface in a vertical direction. The tightness of the filler 208 may affect the heat insulation capacity of the filler 208 (the higher the tightness of the filler 208 is, the better the heat insulation capacity and the stability of the formed temperature field may be), which may affect the temperature gradient below a melt interface in the vertical direction. Different filling heights and/or tightness may correspond to different temperature gradients. In some embodiments, when the second drum 206 is cracked, the filler 208 filled in the space between the first drum 204 and the second drum 206 may act as a thermal insulation layer to prevent a drastic change caused by a communication between the temperature field device 200 and the external environment, which may affect the crystal growth. The thermal insulation layer formed by the filler 208 may maintain the temperature gradient in the temperature field device 200 in the above-mentioned case to avoid a sudden temperature change. In some embodiments, the filler 208 may include a particulate material. The filler 208 may include a zircon sand (a zirconium silicate compound), a zirconia particle, an alumina particle, etc. A particle size of the filler 208 may be 5 mesh~200 mesh. Preferably, the particle size of the filler 208 may be 10 mesh~190 mesh. More preferably, the particle size of the filler 208 may be 20 mesh~180 mesh. More preferably, the particle size of the filler 208 may be 30 mesh~170 mesh. More preferably, the particle size of the filler 208 may be 40 mesh~160 mesh. More preferably, the particle size of the filler 208 may be 50 mesh~150 mesh. More preferably, the particle size of the filler 208 may be 60 mesh~140 mesh. More preferably, the particle size of the filler 208 may be 70 mesh~130 mesh. More preferably, the particle size of the filler 208 may be 80 mesh~120 mesh. More preferably, the particle size of the filler 208 may be 90 mesh~110 mesh. More preferably, the particle size of the filler 208 may be 90 mesh~110 mesh. In some embodiments, the filler 208 may include a substance with a shape of felt, including a zirconia felt. In some embodiments, the filler 208 may be a mixture of a substance with a shape of particle and felt, including a mixture of a zirconia felt with one or more of a zirconia sand, a zirconia particle, and an alumina particle.

In some embodiments, the filler 208 filled in the second drum 206 may be configured to support the crucible 214 containing the reactants for the crystal growth. The filler 208 may cover a portion of the crucible 214, for example, a bottom and a side wall of the crucible 214. In order to prevent the filler 208 from falling into the crucible 214 and contaminating the reactants, an upper edge of the crucible 214 may be higher than the filling height of the filler 208 filled in the second drum 206. In some embodiments, the second drum 206 may prevent the filler 208 filled in the space between the first drum 204 and the second drum 206 from falling into the crucible 214. In some embodiments, the crucible 214 may be made of iridium (Ir), molybdenum (Mo), tungsten (W), rhenium (Re), graphite (C), tungsten-molybdenum alloy, or the like, or any combination thereof. Preferably, the crucible 214 may be an iridium crucible. In some embodiments, a diameter of the crucible 214 may be 60 mm~250 mm. Preferably, the diameter of the crucible 214 may be 80 mm~220 mm. More preferably, the diameter of the crucible 214 may be 100 mm~200 mm. More preferably, the diameter of the crucible 214 may be 110 mm~190 mm. More preferably, the diameter of the crucible 214 may be 120 mm~180 mm. More preferably, the diameter of the crucible 214 may be 130 mm~170 mm. More preferably, the diameter of the crucible 214 may be 140 mm~160 mm. More preferably, the diameter of the crucible 214 may be 145 mm~155 mm. A thickness of the crucible 214 may be 2 mm~4 mm. Preferably, the thickness of the crucible 214 may be 2.2 mm~3.8 mm. More preferably, the thickness of the crucible 214 may be 2.5 mm~3.5 mm. More preferably, the thickness of the crucible 214 may be 2.6 mm~3.4 mm. More preferably, the thickness of the crucible 214 may be 2.7 mm~3.3 mm. More preferably, the thickness of the crucible 214 may be 2.8 mm~3.2 mm. More preferably, the thickness of the crucible 214 may be 2.9 mm~3.1 mm. A height of the crucible 214 may be 60 mm~250 mm. Preferably, the height of the crucible 214 may be 80 mm~220 mm. More preferably, the height of the crucible 214 may be 100 mm~200 mm. More preferably, the height of the crucible 214 may be 110 mm~190 mm. More preferably, the height of the crucible 214 may be 120 mm~180 mm. More preferably, the height of the crucible 214 may be 130 mm~170 mm. More preferably, the height of the crucible 214 may be 140 mm~160 mm. More preferably, the height of the crucible 214 may be 145 mm~155 mm.

Figure 3:
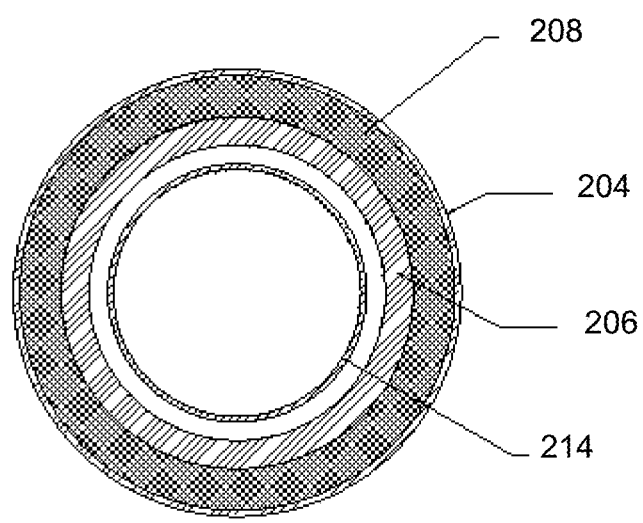
FIG. 3 is a top view of an exemplary temperature field device according to some embodiments of the present disclosure.

FIG. 3 is a top view of the temperature field device 200 according to some embodiments of the present disclosure. As shown in FIG. 3, a periphery of the temperature field device 200 may be the first drum 204. A space between the second drum 206 and the first drum 204 may be filled with the filler 208. The crucible 214 may be placed in the second drum 206 and supported by the filler 208 which is filled at the bottom of the second drum 206. It can be clearly seen that components of the temperature field device 200 from outside to inside may successively include the first drum 204, the filler 208, the second drum 206, and the crucible 214. In some embodiments, the above-mentioned four components may form a concentric circle, and a concentricity may be less than 1 mm. More preferably, the concentricity may be less than 0.9 mm. More preferably, the concentricity may be less than 0.8 mm. More preferably, the concentricity may be less than 0.7 mm. More preferably, the concentricity may be less than 0.6 mm. More preferably, the concentricity may be less than 0.5 mm. More preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing the crystal, observing the crystal growth, introducing the flowing gas, and pulling up the crystal.

In some embodiments, the crucible 214 may be used as a heater to melt the reactants contained therein to facilitate subsequent crystal growth. An induction coil (such as the induction coil 216 illustrated in FIG. 2) surrounding the outer wall of the first drum 204 may generate an alternating magnetic field when an alternating current with a certain frequency is being passed. A closed induced current, (i.e., an eddy current) may be generated in a conductor (e.g., the crucible 214) caused by the electromagnetic induction of the alternating magnetic field. The induced current may be unevenly distributed on a cross-section of the conductor and the electrical energy of a high-density current on a surface of the conductor may be converted into the heat energy to increase the temperature of the conductor to melt the reactants. The induction coil 216 may include a coil with 5 turns~14 turns. Preferably, the induction coil 216 may include a coil with 6 turns~13 turns. More preferably, the induction coil 216 may include a coil with 7 turns~12 turns. More preferably, the induction coil 216 may include a coil with 8 turns~11 turns. More preferably, the induction coil 216 may include a coil with 9 turns~10 turns. An induction frequency may be 2 kHz~15 kHz. Preferably, the induction frequency may be 3 kHz~14 kHz. More preferably, the induction frequency may be 4 kHz~13 kHz. More preferably, the induction frequency may be 5 kHz~12 kHz. More preferably, the induction frequency may be 6 kHz~11 kHz. More preferably, the induction frequency may be 7 kHz~10 kHz. More preferably, the induction frequency may be 8 kHz~9 kHz. An induction rated power of the induction coil 216 may be 20 kW 60 kW Preferably, the induction rated power of the induction coil 216 may be 30 kW~50 kW More preferably, the induction rated power of the induction coil 216 may be 35~45 kW More preferably, the induction rated power of the induction coil 216 may be 36 kW~44 kW. More preferably, the induction rated power of the induction coil 216 may be 37 kW~43 kW. More preferably, the induction rated power of the induction coil 216 may be 38 kW~42 kW More preferably, the induction rated power of the induction coil 216 may be 39 kW~41 kW. In some embodiments, the filling height of the filler 208 may result in that a vertical distance between an upper edge of the crucible 214 and an upper edge of the induction coil 216 is −20 mm~+6 mm. "−" represents that the upper edge of the crucible 214 is lower than the upper edge of the induction coil 216, and "+" represents that the upper edge of the crucible 214 is higher than the upper edge of the induction coil 216. Preferably, the vertical distance between the upper edge of the crucible 214 and the upper edge of the induction coil 216 may be −17 mm~+3 mm. More preferably, the vertical distance between the upper edge of the crucible 214 and the upper edge of the induction coil 216 may be −13 mm~0 mm. More preferably, the vertical distance between the upper edge of the crucible 214 and the upper edge of the induction coil 216 may be −10 to −3 mm. More preferably, the vertical distance between the upper edge of the crucible 214 and the upper edge of the induction coil 216 may be −9 mm~−4 mm. More preferably, the vertical distance between the upper edge of the crucible 214 and the upper edge of the induction coil 216 may be −8 mm~−5 mm. More preferably, the vertical distance between the upper edge of the crucible 214 and the upper edge of the induction coil 216 may be −7 mm~−6 mm. The temperature gradient of the temperature field device 200 may be adjusted by changing a relative position between the crucible 214 and the induction coil 216. For example, when the crucible 214 is totally within the coil range of the induction coil 216, the heat generated by the crucible 214 may be relatively large; whereas, when only a portion of the crucible 214 is in the coil range of the induction coil 216, the heat generated by the crucible 214 may be relatively small, accordingly, the heat position and/or a space size of heat dissipation in the temperature field device 200 may be determined, and the temperature gradient may be further affected.

The first cover plate 210 may be mounted on a top of the temperature field device 200 to seal the temperature field device 200 together with other components (e.g., the first drum 204). The first cover plate 210 may cover the other open end of the first drum 204. The first cover plate 210 may be connected to the first drum 204 via a welding connection, a riveting connection, a bolt connection, a bonding connection, or the like, or any combination thereof. For example, a silicone sealing ring may be used at a joint between the first cover plate 210 and the first drum 204, and a screw may be used to screw and seal the first cover plate 210 and the first drum 204. In some embodiments, a material of the first cover plate 210 may be similar to that of the bottom plate 202. The first cover plate 210 may be also made of a heat-reflective material with a relatively high reflection coefficient, such as gold, silver, nickel, aluminum foil, copper, molybdenum, coated metal, stainless steel, etc. Preferably, the first cover plate 210 may include a copper plate. When the first cover plate 210 is being mounted, a concentricity of the first cover plate 210 and the first drum 204 may be less than 0.5 mm. Preferably, the concentricity of the first cover plate 210 and the first drum 204 may be less than 0.4 mm. More preferably, the concentricity of the first cover plate 210 and the first drum 204 may be less than 0.3 mm. More preferably, the concentricity of the first cover plate 210 and the first drum 204 may be less than 0.2 mm. More preferably, the concentricity of the first cover plate 210 and the first drum 204 may be less than 0.1 mm. In some embodiments, a diameter of the first cover plate 210 may be 200 mm~500 mm. Preferably, the diameter of the first cover plate 210 may be 250 mm~450 mm. More preferably, the diameter of the first cover plate 210 may be 300-mm~400 mm. More preferably, the diameter of the first cover plate 210 may be 310 mm~390 mm. More preferably, the diameter of the first cover plate 210 may be 320 mm~380 mm. More preferably, the diameter of the first cover plate 210 may be 430 mm~370 mm. More preferably, the diameter of the first cover plate 210 may be 440 mm~360 mm. In some embodiments, a thickness of the first cover plate 210 may be 10 mm~40 mm. Preferably, the thickness of the first cover plate 210 may be 15 mm~35 mm. More preferably, the thickness of the first cover plate 210 may be 20 mm~30 mm. More preferably, the thickness of the first cover plate 210 may be 21 mm~29 mm. More preferably, the thickness of the first cover plate 210 may be 22 mm~28 mm. More preferably, the thickness of the first cover plate 210 may be 23 mm~27 mm. More preferably, the thickness of the first cover plate 210 may be 24 mm~26 mm. In some embodiments, the first cover plate 210 may include at least two first through holes. The first through hole may be configured to pass gas. For example, the first through holes may constitute a channel for the gas to enter into or exit the temperature field device 200. The gas may be introduced into the temperature field device 200 through one or more first through holes of the at least two first through holes and be discharged from the temperature field device 200 through the remaining first through hole(s). In some embodiments, the gas may include one or more inert gases, including nitrogen, helium, neon, argon, krypton, xenon, radon, etc. In some embodiments, the gas may include a mixed gas of oxygen and/or carbon monoxide with one or more inert gases. According to the characteristics and size of the crystal to be grown, a flow rate of the gas introduced into the temperature field device 200 may be 0.01 L/min~50 L/min. Preferably, the flow rate of the introduced gas may be 0.01 L/min~50 L/min. More preferably, the flow rate of the introduced gas may be 0.1 L/min~50 L/min. More preferably, the flow rate of the introduced gas may be 1 L/min~50 L/min. More preferably, the flow rate of the introduced gas may be 5 L/min~45/min. More preferably, the flow rate of the introduced gas may be 10 L/min~40 L/min. More preferably, the flow rate of the introduced gas may be 15 L/min~35 L/min. Preferably, the flow rate of the introduced gas may be 20 L/min~30 L/min. More preferably, the flow rate of the introduced gas may be 21 L/min~29 L/min. More preferably, the flow rate of the introduced gas may be 22 L/min~28 L/min. More preferably, the flow rate of the introduced gas may be 23 L/min~27 L/min. More preferably, the flow rate of the introduced gas may be 24 L/min~26 L/min.

Figure 4:
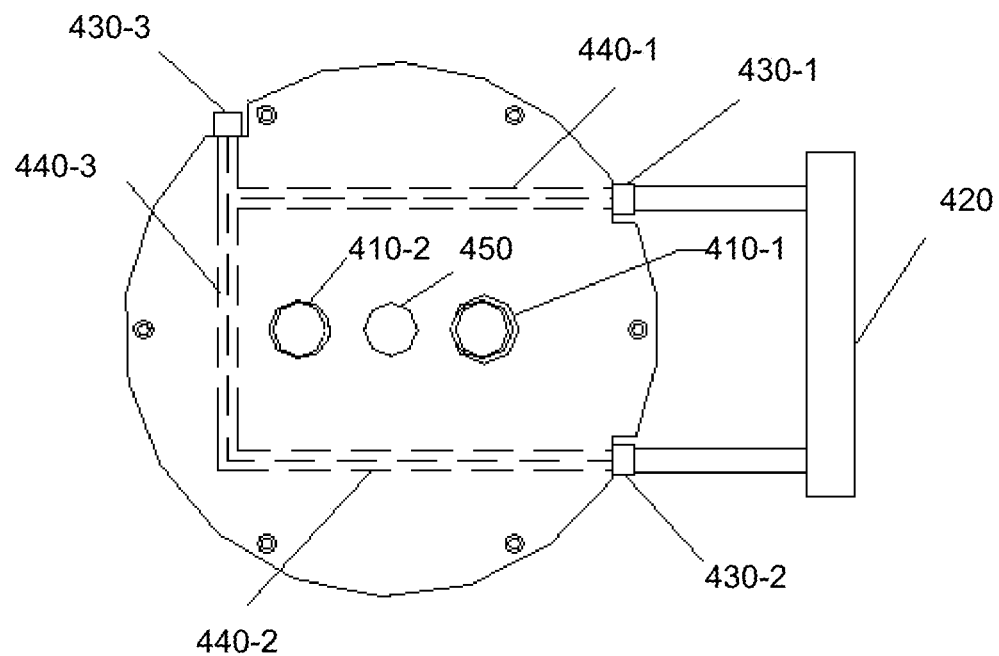
FIG. 4 is a schematic diagram illustrating an exemplary first cover plate according to some embodiments of the present disclosure.

In some embodiments, other components may be mounted on the first cover plate 210. FIG. 4 is a schematic diagram illustrating the first cover plate 210 according to some embodiments of the present disclosure. As shown in FIG. 4, the first cover plate 210 may include two first through holes 410-1 and 410-2 through which a gas may enter into or exit from a temperature field device 200. In some embodiments, diameters of the first through holes 410-1 and 410-2 may be 15 mm~30 mm. Preferably, the diameters of the first through holes 410-1 and 410-2 may be 18 mm~27 mm. More preferably, the diameters of the first through holes 410-1 and 410-2 may be 20 mm~25 mm. More preferably, the diameter of the first through holes 410-1 and 410-2 may be 21 mm~24 mm. More preferably, the diameters of the first through holes 410-1 and 410-2 may be 22 mm~23 mm. In some embodiments, rotation central axes of the first through holes 410-1 and 410-2 may be perpendicular to the horizontal plane. In some embodiments, the rotation central axes of the first through holes 410-1 and 410-2 may be at angles of 3 degrees~20 degrees with a vertical line of the horizontal plane. Preferably, the rotation central axes of the first through holes 410-1 and 410-2 may be at angles of 5 degrees~18 degrees with the vertical line of the horizontal plane. More preferably, the rotation central axes of the first through holes 410-1 and 410-2 may be at angles of 7 degrees~15 degrees with the vertical line of the horizontal plane. More preferably, the rotation center axes of the first through holes 410-1 and 410-2 may be at angles of 9 degrees~13 degrees with the vertical line of the horizontal plane. More preferably, the rotation center axis of the first through holes 410-1 and 410-2 may be at angles of 11 degrees~12 degrees with the vertical line of the horizontal plane. A distance between centers of the two through holes may be 70 mm~150 mm. Preferably, the distance between the centers of the two through holes may be 80 mm~140 mm. More preferably, the distance between the centers of two through holes may be 90 mm~130 mm. More preferably, the distance between the centers of the two through holes may be 100 mm~120 mm. More preferably, the distance between the centers of the two through holes may be 105 mm~115 mm. More preferably, the distance between the centers of the two through holes may be 107 mm~113 mm. More preferably, the distance between the centers of the two through holes may be 109 mm~111 mm.

Figure 5:
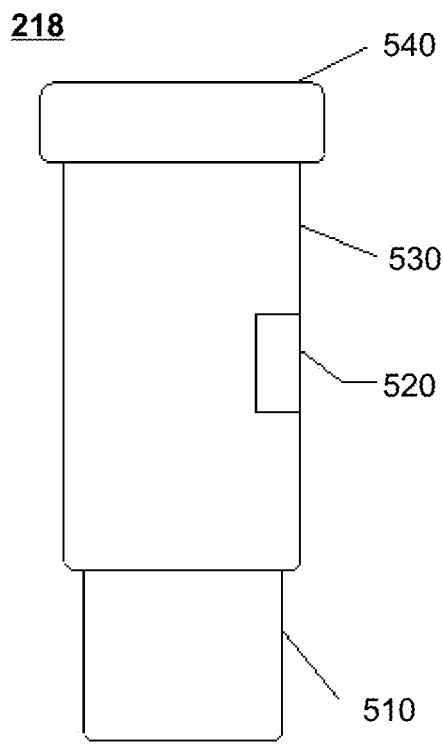
FIG. 5 is a schematic diagram illustrating an exemplary observation unit according to some embodiments of the present disclosure.

In some embodiments, the observation unit 218 may be mounted above the first through holes 410-1 and 410-2. Since the crystal growth period (e.g., 4 days~40 days) is relatively long, a unit through which the internal situation of the temperature field device 200 can be observed may be mounted on the temperature field device 200. A user (e.g., a worker in a factory) can observe the growth of the crystal through the observation unit 218. If an abnormal situation is found, timely remedial action can be executed. FIG. 5 is a schematic diagram illustrating the observation unit 218 according to some embodiments of the present disclosure. The observation unit 218 may include a tubular component with a closed end and an open end. The observation unit 218 may include a first part 510. A size of the first part 510 may match that of the first through hole 410-1/410-2 of the first cover plate 210, thereby realizing a connection between the observation unit 218 and the first cover plate 210, for example, via a riveting connection, a screw connection, etc. In some embodiments, a lower end of the first part 510 may be open, accordingly, after the observation unit 218 is connected with the first cover plate 210, a connection between an inner chamber of the observation unit 218 and the first through hole 410-1/410-2 can be achieved. According to the diameter of the first through hole 410-1/410-2, a diameter of the first part 510 may be 15 mm~30 mm. Preferably, the diameter of the first part 510 may be 18 mm~27 mm. More preferably, the diameter of the first part 510 may be 20 mm~25 mm. More preferably, the diameter of the first part 510 may be 21 mm~24 mm. More preferably, the diameter of the first part 510 may be 22 mm~23 mm. The observation unit 218 may further include a second through hole 520. The second through hole 520 may be opened at any position of a second part 530 of the observation unit 218, and communicate with the internal chamber of the observation unit 218. After the observation unit 218 is connected with the first through hole 410-1/410-2, the second through hole 520 may be configured to realize the function of gas passing. In some embodiments, a diameter of the second through hole 520 may be 3 mm~10 mm. Preferably, the diameter of the second through hole 520 may be 4 mm~9 mm. More preferably, the diameter of the second through hole 520 may be 5 mm~8 mm. More preferably, the diameter of the second through hole 520 may be 6 mm~7 mm. The second part 530 may be a part that is protruded outside the first cover plate 210 after the observation unit 218 is connected with the first through hole 410-1/410-2. A height of the second part 530 may be 50 mm~100 mm. Preferably, the height of the second part 530 may be 60 mm~90 mm. Preferably, the height of the second part 530 may be 70 mm~80 mm. More preferably, the height of the second part 530 may be 71 mm~79 mm. More preferably, the height of the second part 530 may be 72 mm~78 mm. More preferably, the height of the second part 530 may be 73 mm~77 mm. More preferably, the height of the second part 530 may be 74 mm~76 mm. In some embodiments, a diameter of the second part 530 may be 26 mm~66 mm. Preferably, the diameter of the second part 530 may be 30 mm~60 mm. More preferably, the diameter of the second part 530 may be 35 mm~55 mm. More preferably, the diameter of the second part 530 may be 40 mm~500 mm. More preferably, the diameter of the second part 530 may be 40 mm~500 mm. More preferably, the diameter of the second part 530 may be 42 mm~48 mm. More preferably, the diameter of the second part 530 may be 43 mm~47 mm. More preferably, the diameter of the second part 530 may be 44 mm~46 mm. The observation unit 218 may further include an observation window 540. The observation window 540 may be mounted on a top of the observation unit 218, and be made of a transparent material, such as quartz, polymethyl methacrylate (PMMA), polystyrene (PS), polycarbonate (PC), etc. The user (e.g., a factory worker) may observe an internal situation of the temperature field device 200 through the observation window 540.

Similarly, in order to reduce heat radiation emitted above the temperature field device 200, circulating cooling liquid channel(s) may be mounted on the first cover plate 210. As shown in FIG. 4, the first cover plate 210 may include a cooling liquid channel 420. A cooling liquid may flow through the cooling liquid channel 420. The cooling liquid may include water, ethanol, ethylene glycol, isopropanol, n-hexane, or the like, or any combination thereof. For example, the cooling liquid may include a 50:50 mixed liquid of water and ethanol. The cooling liquid may flow into circulating cooling liquid channels 440-1, 440-2, and 440-3 mounted inside the first cover plate 210 through cooling liquid inlets 430-1 and/or 430-2. After absorbing heat dissipated from the temperature field device 200 during the flow process, the cooling liquid may flow out through a cooling liquid outlet 430-3. The flowed out cooling liquid may return to the cooling liquid channel 420 through other channels, and a next cycle may be performed. In some embodiments, diameters of the circulating cooling liquid channels 440-1, 440-2, and 440-3 may be 5 mm~25 mm. Preferably, the diameters of the circulating cooling liquid channels 440-1, 440-2, and 440-3 may be 10 mm~20 mm. More preferably, the diameters of the circulating cooling liquid channels 440-1, 440-2, and 440-3 may be 11 mm~19 mm. More preferably, the diameters of the circulating cooling liquid channels 440-1, 440-2, and 440-3 may be 12 mm~18 mm. More preferably, the diameters of the circulating cooling liquid channels 440-1, 440-2, and 440-3 may be 13 mm~17 mm. More preferably, the diameters of the circulating cooling liquid channels 440-1, 440-2, and 440-3 may be 14 mm~15 mm.

In some embodiments, the first cover plate 210 may further include a third through hole 450. For example, when the crystal growth is executed based on the Czochralski technique, a channel (e.g., the third through hole 450) for the pulling rod to enter into or exit from the temperature field device 200 may be mounted on the first cover plate 210. The pulling rod may include an iridium rod. The third through hole 450 may be mounted at a center of the first cover plate 210. A size of the third through hole 450 may be determined based on a size of the pulling rod. In some embodiments, a shape of the third through hole 450 may be various. For example, the shape of the third through hole may include a regular shape such as a circle, a square, a rectangle, a diamond, a regular triangle, or any other irregular shape. In some embodiments, an area of the third through hole 450 may be 100 $mm^2$~3000 $mm^2$. Preferably, the area of the third through hole 450 may be 200 $mm^2$~2900 $mm^2$. More preferably, the area of the third through hole 450 may be 300 $mm^2$~2800 $mm^2$. More preferably, the area of the third through hole 450 may be 400 $mm^2$~2700 $mm^2$. More preferably, the area of the third through hole 450 may be 500 $mm^2$~2600 $mm^2$. More preferably, the area of the third through hole 450 may be 600 $mm^2$~2500 $mm^2$. More preferably, the area of the third through hole 450 may be 700 $mm^2$~2400 $mm^2$. More preferably, the area of the third through hole 450 may be 800 $mm^2$~2300 $mm^2$. More preferably, the area of the third through hole 450 may be 900 $mm^2$~2200 $mm^2$. More preferably, the area of the third through hole 450 may be 1000 $mm^2$~2100 $mm^2$. More preferably, the area of the third through hole 450 may be 1100 $mm^2$~2000 $mm^2$. More preferably, the area of the third through hole 450 may be 1200 $mm^2$~1900 $mm^2$. More preferably, the area of the third through hole 450 may be 1300 $mm^2$~1800 $mm^2$. More preferably, the area of the third through hole 450 may be 1400 $mm^2$~1700 $mm^2$. More preferably, the area of the third through hole 450 may be 1500 $mm^2$~1600 $mm^2$. When the third through hole 450 is a circular through hole, its diameter may be 25 mm~30 mm. More preferably, the diameter of the third through hole 450 may be 26 mm~29 mm. More preferably, the diameter of the third through hole 450 may be 27 mm~28 mm.

The second cover plate 212 may be mounted in the first drum 204. The second cover plate 212 may cover the open end of the second drum 206 near the first cover plate 210, and may be connected to the second drum 206 via a welding connection, a riveting connection, a bolt connection, a bonding connection, etc. In some embodiments, the second cover plate 212 may be made of a material with a relatively good heat insulation performance to achieve heat preservation and heat insulation functions. The second cover plate 212 may include an alumina plate, a zirconia plate, a ceramic plate, a metal plate, etc. In some embodiments, a diameter of the second cover plate 212 may be determined based on the inner diameter of the first drum 204. The second cover plate 212 may fit the inner wall of the first drum 204. The second cover plate 212 may cover one end of the second drum 206, thereby preventing the filler 208 filled in the space between the first drum 204 and the second drum 206 from falling out and contaminating the reactants in the crucible 214. In order to observe the internal situation of the temperature field device 200 from outside in existence of the second cover plate 212, through holes (also referred to as fourth through holes) corresponding to the through holes (e.g., the first through hole 410-1/410-2, the third through hole 450) on the first cover plate 210 may be opened on the second cover plate 212. The fourth through holes may have same rotation central axes as the first through hole and the third through hole. That is, the fourth through holes may be opened on the second cover plate 212 along the rotation central axes of the first and/or third through holes. In some embodiments, diameters of the fourth through holes corresponding to the first through hole 410-1/410-2 may be 8 mm~15 mm. Preferably, the diameters of the fourth through holes corresponding to the first through hole 410-1/410-2 may be 9 mm~14 mm. More preferably, the diameters of the fourth through holes corresponding to the first through hole 410-1/410-2 may be 10 mm~13 mm. More preferably, the diameters of the fourth through holes corresponding to the first through hole 410-1/410-2 may be 11 mm~12 mm. Rotation central axes of the fourth through holes corresponding to the first through hole 410-1/410-2 may be at angles of 3 degrees~20 degrees with the vertical line of the horizontal plane. More preferably, the rotation center axes of the fourth through holes corresponding to the first through hole 410-1/410-2 may be at angles of 5 degrees~18 degrees with the vertical line of the horizontal plane. More preferably, the rotation center axes of the fourth through holes corresponding to the first through hole 410-1/410-2 may be at angles of 7 degrees~15 degrees with the vertical line of the horizontal plane. More preferably, the rotation center axes of the fourth through holes corresponding to the first through hole 410-1/410-2 may be at angles of 9 degrees~13 degrees with the vertical line of the horizontal plane. More preferably, the rotation center axes of the fourth through holes corresponding to the first through hole 410-1/410-2 may be at angles of 11 degrees~12 degrees with the vertical line of the horizontal plane. A distance between centers of the fourth through holes corresponding to the first through hole 410-1/410-2 may be 50 mm~140 mm. Preferably, the distance between the centers of the fourth through holes corresponding to the first through hole 410-1/410-2 may be 60 mm~130 mm. More preferably, the distance between the centers of the fourth through holes corresponding to the first through hole 410-1/410-2 may be 70 mm~140 mm. More preferably, the distance between the centers of the fourth through holes corresponding to the first through hole 410-1/410-2 may be 80 mm~110 mm. More preferably, the distance between the centers of the fourth through holes corresponding to the first through hole 410-1/410-2 may be 90 mm~100 mm. More preferably, the distance between the centers of the fourth through holes corresponding to the first through hole 410-1/410-2 may be 91 mm~99 mm. More preferably, the distance between the centers of the fourth through holes corresponding to the first through hole 410-1/410-2 may be 92 mm~98 mm. More preferably, the distance between the centers of the fourth through holes corresponding to the first through hole 410-1/410-2 may be 93 mm~97 mm. More preferably, the distance between the centers of the fourth through holes corresponding to the first through hole 410-1/410-2 may be 94 mm~96 mm. In some embodiments, a diameter of a fourth through hole corresponding to the third through hole may be 10 mm~150 mm. Preferably, the diameter of the fourth through hole corresponding to the third through hole may be 20 mm~140 mm. More preferably, the diameter of the fourth through hole corresponding to the third through hole may be 30 mm~130 mm. More preferably, the diameter of the fourth through hole corresponding to the third through hole may be 40 mm~120 mm. More preferably, the diameter of the fourth through hole corresponding to the third through hole may be 50 mm~110 mm. More preferably, the diameter of the fourth through hole corresponding to the third through hole may be 60 mm~100 mm. More preferably, the diameter of the fourth through hole corresponding to the third through hole may be 70 mm~90 mm. More preferably, the diameter of the fourth through hole corresponding to the third through hole may be 75 mm~85 mm. The diameter of the fourth through hole corresponding to the third through hole may affect the amount of heat dissipated through the fourth through hole, thereby affecting the temperature gradient of the temperature field device 200. Therefore, the temperature gradient of the temperature field device 200 can be adjusted by changing the diameter of the fourth through hole corresponding to the third through hole. In some embodiments, an automatic feeder may be used at the fourth through hole corresponding to the first through hole 410-1/410-2, which can automatically add the reactants to the crucible 214. In this case, a concentration gradient caused by the reactants during the crystal growth may be constant, thereby improving the uniformity and consistency of the crystal growth.

In some embodiments, a thickness of the second cover plate 212 may be 20 mm~35 mm. preferably, the thickness of the second cover plate 212 may be 25 mm~30 mm. More preferably, the thickness of the second cover plate 212 may be 26 mm~29 mm. More preferably, the thickness of the second cover plate 212 may be 27 mm~28 mm. In some embodiments, a position of the second cover plate 212 in the temperature field device 200 may be determined based on the length and/or the position of the second drum 206. When the length of the second drum 206 is greater than a length threshold, the second cover plate 212 may be close to the first cover plate 210. A certain distance may be maintained between the second cover plate 212 and the first cover plate 210.

The sealing ring 220 and/or the pressure ring 222 may achieve a seal between the first drum 204 and the first cover plate 210. In some embodiments, the sealing ring 220 may be mounted at the joint between the first drum 204 and the first cover plate 210. The sealing ring 220 may be made of a material having a certain elasticity, for example, silicone, rubber, etc. An inner diameter of the sealing ring 220 may be less than or equal to the outer diameter of the first drum 204, such that when the sealing ring 220 is mounted, the sealing ring 220 may be stretched to seal effectively the space between the first drum 204 and the first cover plate 210. In some embodiments, the inner diameter of the sealing ring 220 may be 170 mm~540 mm. Preferably, the inner diameter of the sealing ring 220 may be 200 mm~510 mm. More preferably, the inner diameter of the sealing ring 220 may be 250 mm~350 mm. More preferably, the inner diameter of the sealing ring 220 may be 260 mm~340 mm. More preferably, the inner diameter of the sealing ring 220 may be 270 mm~330 mm. More preferably, the inner diameter of the sealing ring 220 may be 280 mm~320 mm. More preferably, the inner diameter of the sealing ring 220 may be 290 mm~310 mm. A wire diameter of the sealing ring 220 may be 5 mm~10 mm. Preferably, the wire diameter of the sealing ring 220 may be 6 mm~9 mm. More preferably, the wire diameter of the sealing ring 220 may be 7 mm~8 mm.

The pressure ring 222 may be configured to perform a fixing and compressing function for the sealing ring 220. In some embodiments, a shape of the pressure ring 222 may match that of the first drum 204. An inner diameter of the pressure ring 222 may be greater than the outer diameter of the first drum 204. In this case, the pressure ring 222 may be nested on the first drum 204 and be movable. The pressure ring 222 may include a threaded hole corresponding to the first cover plate 210. When the pressure ring 222 is being mounted, the sealing ring 220 may be mounted between the pressure ring 222 and the first cover plate 210. The pressure ring 222 may be connected to the first cover plate 210 via a thread, thereby compressing the sealing ring 220, enlarging a contact surface between the pressure ring 222 and the space between the first drum 204 and the first cover plate 210, causing the contact tight, and achieving the purpose of effective sealing. In some embodiments, other items (e.g., a vacuum grease) may also be used to achieve the sealing. When the sealing ring 220 is being mounted, the sealing ring 220 may be covered with the vacuum grease to achieve more effective sealing. In some embodiments, the pressure ring 222 and the first cover plate 210 may also be connected by a buckle connection. In some embodiments, an outer diameter of the pressure ring 222 may be 200 mm~500 mm. Preferably, the outer diameter of the pressure ring 222 may be 250 mm~450 mm. More preferably, the outer diameter of the pressure ring 222 may be 300 mm~400 mm. More preferably, the outer diameter of the pressure ring 222 may be 310 mm~390 mm. More preferably, the outer diameter of the pressure ring 222 may be 320 mm~380 mm. More preferably, the outer diameter of the pressure ring 222 may be 430 mm~370 mm. More preferably, the outer diameter of the pressure ring 222 may be 440 mm~360 mm. More preferably, the outer diameter of the pressure ring 222 may be 345 mm~355 mm. An inner diameter of the pressure ring 222 may be 190 mm~460 mm. Preferably, the inner diameter of the pressure ring 222 may be 220 mm~530 mm. More preferably, the inner diameter of the pressure ring 222 may be 250 mm~400 mm. Preferably, the inner diameter of the pressure ring 222 may be 280 mm~520 mm. More preferably, the inner diameter of the pressure ring 222 may be 300 mm~400 mm. More preferably, the inner diameter of the pressure ring 222 may be 310 mm~390 mm. More preferably, the inner diameter of the pressure ring 222 may be 320 mm~380 mm. More preferably, the inner diameter of the pressure ring 222 may be 430 mm~370 mm. Preferably, the inner diameter of the pressure ring 222 may be 440 mm~360 mm. More preferably, the inner diameter of the pressure ring 222 may be 345 mm~355 mm. A thickness of the pressure ring 222 may be 8 mm~15 mm. Preferably, the thickness of the pressure ring 222 may be 10 mm~13 mm. More preferably, the thickness of the pressing ring 222 may be 11 mm~12 mm.

In some embodiments, the temperature field device 200 may further include the gas channel 224 (also referred to as a gas inlet and outlet 224). The gas channel 224 may be mounted on the observation unit 218. A size of the gas channel may be matched with the second through hole 520 to form a through tube protruding from the observation unit 218. In this case, the gas channel 224 may be connected to a gas inlet tube and/or a gas outlet tube to introduce the gas into the temperature field device 200.

In some embodiments, the temperature field device 200 may be applied in crystal growth. After being weighed and performed a preprocessing operation (e.g., an operation of high-temperature roasting, room temperature mixing, isostatic pressing) according to a reaction equation, the reactants for growing the crystal may be placed in the crucible 214 for reaction. Different crystals may need different growth conditions, for example, different temperature gradients. Accordingly, the temperature gradient may be adjusted by changing an amount and a tightness of the filler 208 filled in the temperature field device 200 (e.g., the filler 208 filled in the second drum 206). For example, the amount of the filler 208 may determine the relative position of the crucible 214 and the induction coil 216, and further determine a heating center of the temperature field. In some embodiments, the higher the tightness of the filler 208 is, the better the heat preservation capacity and the stability of the formed temperature field may be, and the more beneficial for crystal growth may be. After the amount and tightness of the filler 208 are determined, other components may be mounted and sealed. After all the components are mounted, a gas may be introduced into the temperature field device 200, and an auxiliary component such as a cooling circulation pump may be activated to introduce a cooling liquid to the circulating cooling liquid channel(s) in the bottom plate 202 and the first cover plate 210. Then, the crystal growth device (including the temperature field device 200) may be activated to start the crystal growth. The gas introduced into the temperature field device 200 may enter through one or more first through holes (e.g., one or more gas channels 224). The gas discharged from the inside of the temperature field device 200 may be discharged from the remaining first through holes (e.g., one or more gas channels 224). When the temperature is suitable, an automatic control program may be activated such that an automatic growth mode may be entered. Through processes such as a necking process, a shouldering process, a constant diameter growth process, an ending process, a cooling process, etc. for a few days, such as 4 days~40 days, the crystal growth may be finalized.

Figure 6:
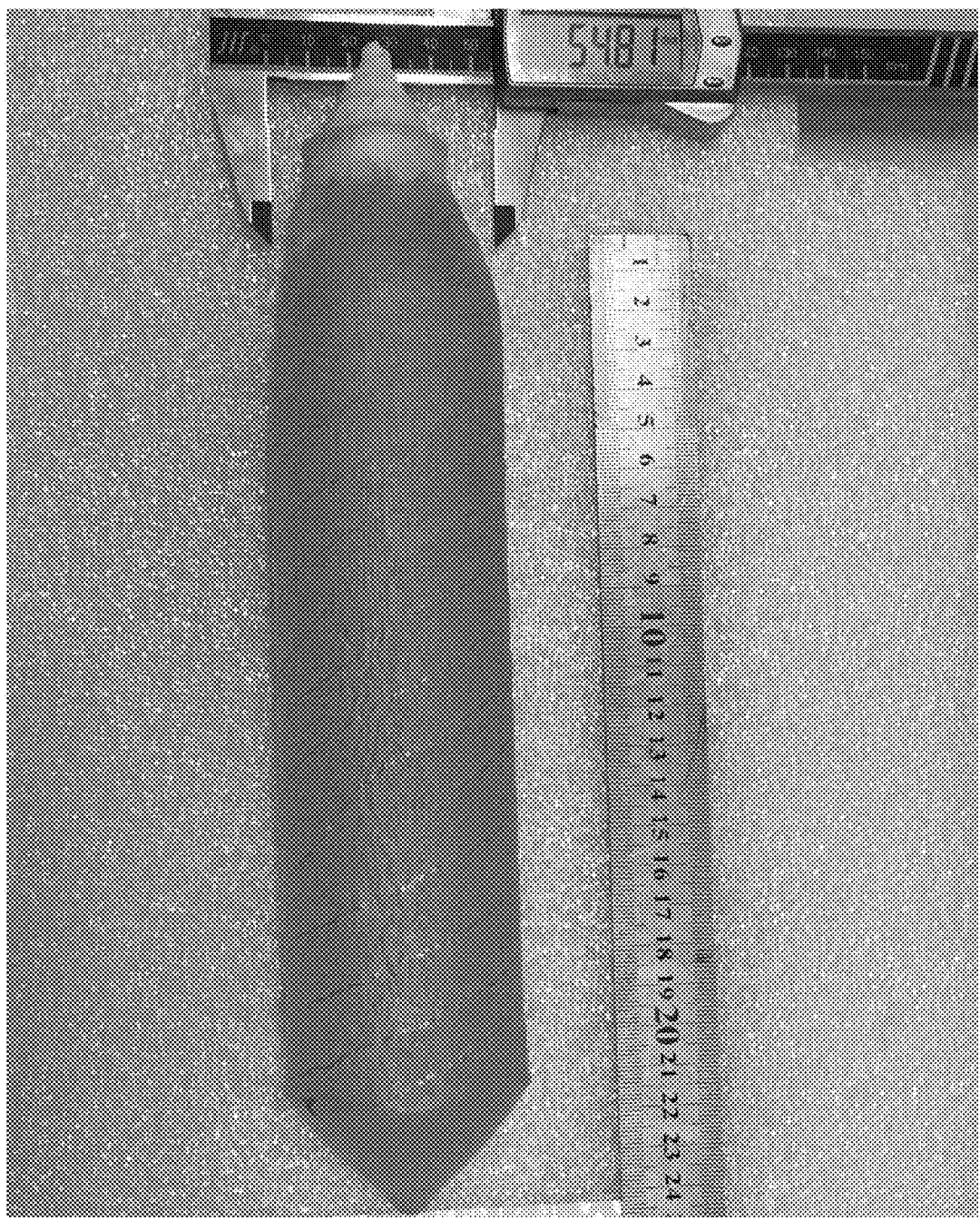
FIG. 6 is an image of an exemplary grown crystal according to some embodiments of the present disclosure.
Figure 7A:
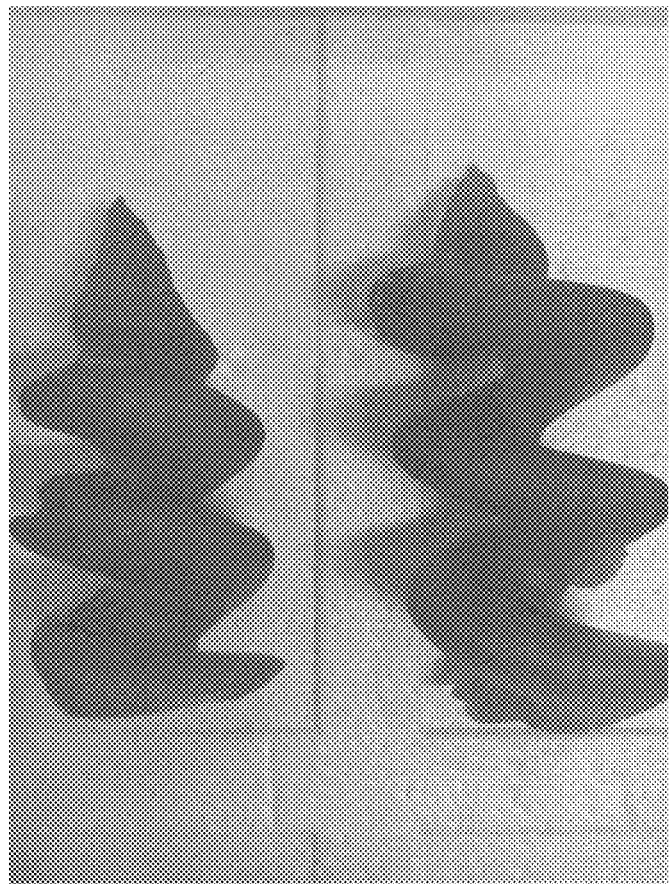
FIG. 7A and FIG. 7B are images of exemplary grown crystals prepared according to traditional crystal growth methods and devices.
Figure 7B:
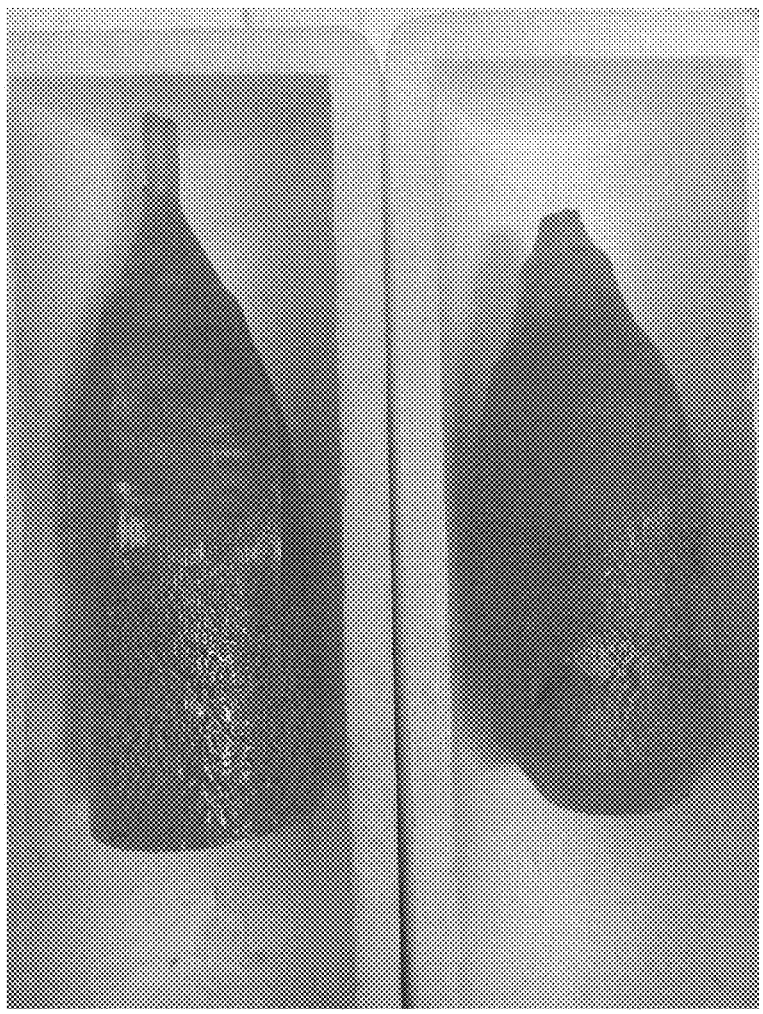

FIG. 6 is an image of an exemplary grown crystal according to some embodiments of the present disclosure. As shown in FIG. 6, a length of the crystal with a rod-like structure with constant diameter is 200 mm and a diameter of the crystal is 54 mm. The crystal has complete appearance, no cracks, no clouds, no dislocations, and no structural defects. FIG. 7A and FIG. 7B are exemplary grown crystals prepared according to traditional crystal growth methods and devices. Compared with the crystal obtained based on the method disclosed in the present disclosure, the crystal shown in FIG. 7A has a spiral shape, a non-constant diameter, a rough surface, and an incomplete appearance. The crystal shown in FIG. 7B has cracks, which cannot meet performance requirements.

Figure 8:
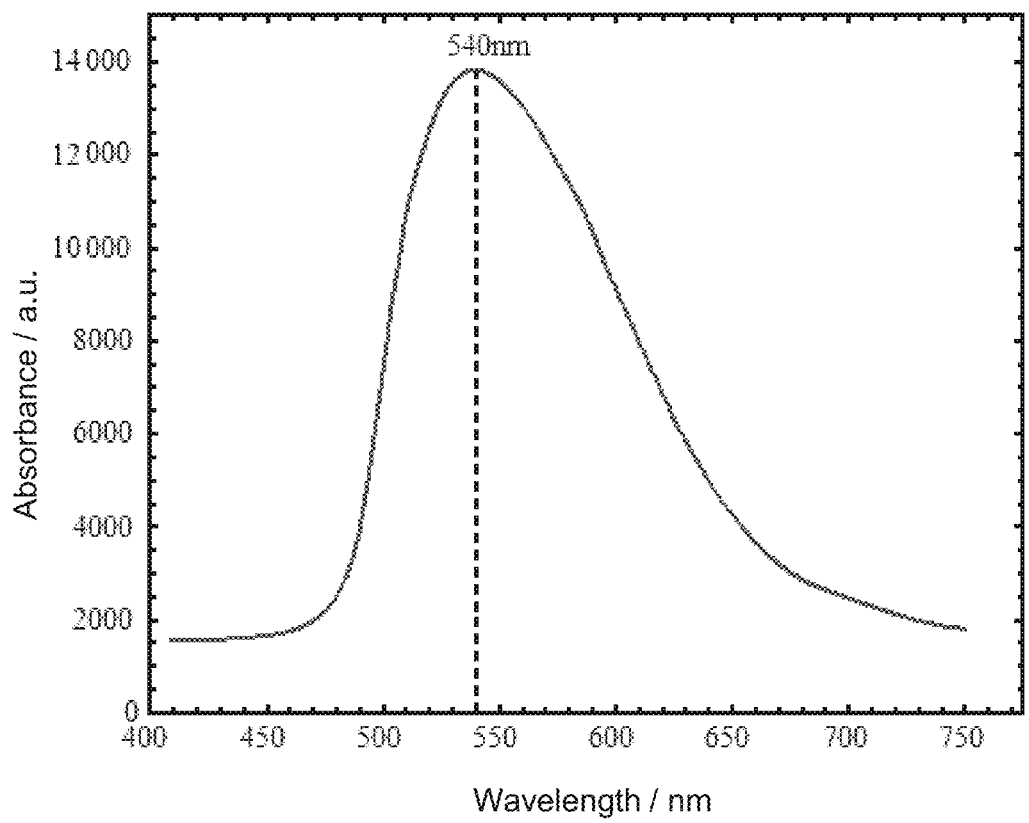
FIG. 8 is an X-ray excitation emission spectrum of an exemplary grown crystal according to some embodiments of the present disclosure.

FIG. 8 is an X-ray excitation emission spectrum of an exemplary grown crystal according to some embodiments of the present disclosure. As shown in FIG. 8, a center wavelength of an emission peak is 540 nm, which corresponds to the 5d→4f→$4F_{5/2}$ electronic transition of $Ce^{3+}$. A shortwave cut-off edge of the emission peak is ~480 nm, which overlaps less with an absorption peak corresponding to the 4f→$5d_1$ transition, indicating that a light output of the grown crystal is less affected by a thickness of the crystal.

According to the devices and the methods for crystal growth of the present disclosure, excessive reactants (e.g., gallium oxide) are used for compensation and a following gas is introduced, which can reduce or avoid deviation of components caused by the volatility of the reactants during the crystal growth and improve the consistency of the crystal performance and the growth repeatability. In some embodiments, a new temperature field device can provide a temperature field with a good temperature gradient and a good uniformity for the crystal growth, which is conducive to avoid crystal cracking. In addition, by optimizing the process parameters of the crystal growth, crystal prepared in different times can have a consistent performance. It should be noted that different embodiments may have different beneficial effects. In different embodiments, possible beneficial effects may include any combination of one or more of the above, or any other possible beneficial effects that may be obtained.

EMBODIMENTS

The present disclosure may be further described through the following specific embodiments.

Example 1—Installation of the Temperature Field Device 200

In step 1, the bottom plate 202 may be mounted on an aluminum plate of a crystal growth device. A level of the bottom plate 202 may be adjusted according to a level requirement of 0.02 mm/m.

In step 2, the second drum 206 may be mounted on the bottom plate 202, and a concentricity and a perpendicularity between the second drum 206 and bottom plate 202 may be adjusted. The concentricity between the second drum 206 and the bottom plate 202 may be less than 0.5 mm and the perpendicularity between the second drum 206 and the bottom plate 202 may be less than 0.2 degrees.

In step 3, the first drum 204 may be mounted on the bottom plate 202, and a concentricity and a perpendicularity between the first drum 204 and bottom plate 202 may be adjusted. The concentricity between the first drum 204 and the bottom plate 202 may be less than 0.5 mm and the perpendicularity of the first drum 204 and the bottom plate 202 may be less than 0.2 degrees. After the first drum 204 is mounted, a high-temperature glue may be used to seal a joint between the first drum 204 and the bottom plate 202, thereby ensuring a positive pressure without air leakage.

In step 4, the filler 208 may be filled in the space between the first drum 204 and the second drum 206, and filled in the bottom of the second drum 206. The amount and the tightness of the filler 208 may be determined according to a growth condition of the crystal to be grown.

In step 5, the crucible 214 may be placed on the filler 208 filled in the bottom of the second drum 206. A vertical distance between an upper edge of the crucible 214 and an upper edge of the induction coil 216 may be −20 mm~+6 mm. "−" represents that the upper edge of crucible 214 is below the upper edge of the induction coil 216. "0" represents that the upper edge of crucible 214 is flush with the upper edge of induction coil 216. "+" represents that the upper edge of the crucible 214 is higher than the upper edge of the induction coil 216. The vertical distance between the upper edge of the crucible 214 and the upper edge of the induction coil 216 may be determined according to the growth condition of the crystal to be grown.

In step 6, the second cover plate 212 may be mounted above the second drum 206, and a concentricity among the second cover plate 212, the first drum 204, and the second drum 206 may be adjusted.

In step 7, the pressure ring 222 and the sealing ring 220 coated with vacuum grease may be mounted.

In step 8, the first cover plate 210 may be mounted above the first drum 204, and a concentricity between the first cover plate 210 and the first drum 204 may be adjusted to ensure that the first through hole(s) (e.g., the first through hole 410-1/410-2) on the first cover plate 210 may have the same axis with the fourth through hole(s) corresponding to the second cover plate 212. The pressure ring 222 and the first cover plate 210 may be connected via a thread connection and the sealing ring 220 may be pressed to achieve the sealing function, thereby ensuring a positive pressure without air leakage.

In step 9, the observation unit 218 may be mounted on the first cover plate 210 and the gas channel 224 may be connected to a gas inlet tube and/or a gas outlet tube. Then the temperature field device 200 would be installed.

Example 2—Ce:GAGG Crystal Growth

The crystal was prepared using the Czochralski technique via a medium-frequency induction heating mode and a single crystal growth induction furnace with an open furnace. A temperature field device was mounted according to steps 1-5 described in Example 1. A roasting process was performed on reactants with a purity of 99.999% at 1200° C. for 5 hours. The reactants were taken out after the reactants were naturally cooled to the room temperature of 35° C. The reactants were weighted based on a molar ratio of the reactants according to the following reaction equation:

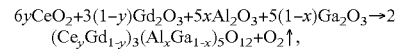

where x=10%, and y=0.3%. A weight of $Ga_2O_3$ exceeded 1% of a weight of $Ga_2O_3$ determined according to the reaction equation. After being weighted, the reactants were placed in a three-dimensional mixer for 0.5 hours~48 hours. The mixed reactants were taken out and then placed in a pressing mold and pressed into a cylindrical shape by a cold isostatic pressing device with a pressure of 100 MPa~300 MPa. Next, the reactants were placed in an iridium crucible with a diameter of 120 mm and a height of 120 mm. The iridium crucible was placed in the mounted temperature field device. A concentricity among the iridium crucible and the temperature field device was adjusted and a crucible position of the iridium crucible was set as +20 mm. A concentricity among the iridium crucible, the second cover plate 212, the first cover plate 210, and a weighing guide rod was successively adjusted, and the seal of the first cover plate 210 and the first drum 204 was ensured. After the observation unit 218 was mounted on the first cover plate 210, a flowing gas and circulating cooling liquid were introduced into the temperature field device. Parameters for the crystal growth were set. A diameter of the crystal was set as 50 mm. A shoulder length was set as 60 mm. A length of the crystal during the constant diameter growth process was set as 180 mm. An ending length was set as 30 mm. A heating time length was set as 24 h. A rotation rate was set as 10 rpm. A pulling rate was set as 1.5 mm/h. A cooling time length was set as 35 h. A PID value was set as 0.5. A crystal density was set as 6.63 g/cm³. A melt density was set as 6 g/cm³. After the parameters were set, [111]-oriented YAG seed crystal was mounted on a top of a pulling rod that is connected to the weighing guide rod. A concentricity between the seed crystal and the first cover plate 210 was adjusted. The temperature was increased to melt the reactants, and the seed crystal was slowly dropped during the heating process for preheating. To avoid cracking of the seed crystal, a distance between the seed crystal and a surface of the reactants was kept as 5 mm~15 mm. After the reactants were melted, the seed crystal was dropped to contact the melt and the temperature was adjusted. During adjusting the temperature, the seed crystal was sunk 0.5 mm~2 mm to effectively contact with the melt, thereby ensuring the interface integrity and reducing the crystal cracking caused at a seeding point during a subsequent cooling process. After the temperature was adjusted as suitable, an automatic control program was started to enter an automatic growth mode to enter a necking process, a shouldering process, a constant diameter growth process, an ending process, and a cooling process. The crystal growth ended after 13 days.

A color of the crystal is yellow and a shape of the crystal is normal as a preset shape. A surface of the crystal is rough with no crystal facets like [111]-oriented YAG. After a head and a tail of the crystal were removed and the remaining portions were polished, an interior of the crystal is transparent. When being irradiated by xx laser, the crystal has no macro defects such as point scattering, a cloud layer, a wrapping material, etc. Through a testing process, a lattice parameter of the crystal is 1.22623 nm; a transmittance of the crystal from ultraviolet, visible light, to near-infrared band is greater than 90%; a center wavelength of the crystal is 540 nm; a light output is greater than or equal to 65000 photons/Mev; an energy resolution is less than or equal to 6%; and a decay time is less than or equal to 90 ns.

Example 3—Ce:GAGG Crystal Growth

The crystal was prepared using the Czochralski technique via a medium-frequency induction heating mode and a single crystal growth induction furnace with an open furnace. A temperature field device was mounted according to steps 1-5 described in Example 1. A roasting process was performed on reactants with a purity of 99.999% at 1200° C. for 5 hours. The reactants were then taken out after the reactants were naturally cooled to the room temperature of 35° C. The reactants were weighted based on a molar ratio of the reactants according to the following reaction equation:

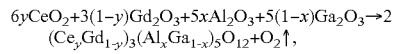
$6yCeO_2+3(1-y)Gd_2O_3+5xAl_2O_3+5(1-x)Ga_2O_3 \rightarrow 2(Ce_yGd_{1-y})_3(Al_xGa_{1-x})_5O_{12}+O_2\uparrow$, where x=20%, and y=0.3%. A weight of $Ga_2O_3$ exceeded 0.2% of a weight of $Ga_2O_3$ determined according to the reaction equation. After being weighted, the reactants were placed in a three-dimensional mixer for 1 hour~6 hours. The reactants were taken out and then placed in a pressing mold and pressed into a cylindrical shape by a cold isostatic pressing device with a pressure of 200 MPa. Next, the reactants were placed in an iridium crucible with a diameter of 180 mm and a height of 180 mm. The iridium crucible was placed in the mounted temperature field device. A concentricity between the iridium crucible and the temperature field device was adjusted and a crucible position of the iridium crucible was set as +20 mm. A concentricity among the iridium crucible, the second cover plate 212, the first cover plate 210 and a weighing guide rod was successively adjusted, and the seal of the first cover plate 210 and the first drum 204 was ensured. After the observation unit 218 was mounted on the first cover plate 210, a flowing gas and circulating cooling liquid were introduced into the temperature field device. Parameters for the crystal growth were set. A diameter of the crystal was set as 80 mm. A shoulder length was set as 90 mm. A length of the crystal during the constant diameter growth process was set as 180 mm. An ending length was set as 45 mm. A heating time length was set as 24 h. A rotation rate was set as 10 rpm. A pulling rate was set as 1.5 mm/h. A cooling time length was set as 35 h. A PID value was set as 0.5. A crystal density was set as 6.63 g/cm³. A melt density was set as 6 g/cm³. After the parameters were set, [111]-oriented YAG seed crystal was mounted on a top of a pulling rod that is connected to the weighing guide rod, and a concentricity between the seed crystal and the first cover plate 210 was adjusted. The temperature was increased to melt the reactants, and the seed crystal was slowly dropped during the heating process for preheating. To avoid cracking of the seed crystal, a distance between the seed crystal and a surface of the reactants was kept as 5 mm~15 mm. After the reactants were melted, the seed crystal was dropped to contact the melt and the temperature was adjusted. During adjusting the temperature, the seed crystal was sunk 0.5 mm~2 mm to effectively contact with the melt, thereby ensuring the interface integrity and reducing the crystal cracking caused at a seeding point during a subsequent cooling process. After the temperature was adjusted as suitable, an automatic control program was started to enter an automatic growth mode to a necking process, a shouldering process, a constant diameter growth process, an ending process, and a cooling process. The crystal growth ended after 16 days.

A color of the crystal is yellow and the crystal has no cracks. A shape of the crystal is normal as a preset shape. A surface of the crystal is rough with no crystal facets like [111]-oriented YAG. After a head and a tail of the crystal were removed and the remaining portions were polished, an interior of the crystal is transparent. The crystal has no macro defects such as point scattering, a cloud layer, a wrapping material, etc. Through a testing process, a lattice parameter of the crystal is 1.22623 nm; a transmittance of the crystal from ultraviolet, visible light, to near-infrared band is greater than 90%; a center wavelength of the crystal is 540 nm; a light output is greater than or equal to 65000 photons/MeV, an energy resolution is less than or equal to 6%; and a decay time is less than or equal to is 90 ns.

Having thus described the basic concepts, it may be rather apparent to those skilled in the art after reading this detailed disclosure that the foregoing detailed disclosure is intended to be presented by way of example only and is not limiting. Although not explicitly stated here, those skilled in the art may make various modifications, improvements and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, particular features, structures, or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict the description, definition, and/or the use of a term associated with any of the incorporated material and that associated with the present document, the description, definition, and/or the use of the term in the present document shall prevail.

At last, it should be understood that the embodiments described in the present disclosure are merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A method for growing a crystal, wherein:
a formula of the crystal is $A_{3y}B_{5x}O_{12}$, wherein
A consists of at least one of lanthanide, at least one of actinide, or at least one of yttrium;
B consists of at least one of aluminum, gallium, indium or scandium; and
x=0.01%~50%, y=0.001%~6%;
the method comprises:
weighting reactants based on a molar ratio of the reactants according to a reaction equation for generating the crystal after a first preprocessing operation is performed on the reactants;
placing the reactants, on which a second preprocessing operation has been performed, into a temperature field device of a crystal growth device, wherein
an observation unit is mounted on the temperature field device and the observation unit includes a through hole and an internal chamber which is communicated with the through hole and the temperature field device, and the through hole is configured for gas passing,
the crystal growth device includes an open hearth and the temperature field device is positioned in the hearth,
the open hearth has gas exchange with atmospheric environment, and
the temperature field device is sealed and has no gas exchange with the atmospheric environment;
introducing a flowing gas into the temperature field device through the through hole after sealing the temperature field device; and
activating the crystal growth device to grow the crystal based on a Czochralski technique.

2. The method of claim 1, wherein:
B includes gallium; and
a weight of a reactant containing gallium exceeds 0.01%~10% of a weight of the reactant containing gallium determined according to the reaction equation or a total weight of the reactants determined according to the reaction equation.

3. A method for growing a crystal, comprising:
weighting reactants based on a molar ratio of the reactants according to a reaction equation (1) after a first preprocessing operation is performed on the reactants, $$6yCeO_2+3(1-y)Gd_2O_3+5xAl_2O_3+5(1-x)Ga_2O_3 \rightarrow 2(Ce_yGd_{1-y})_3(Al_xGa_{1-x})_5O_{12}+2\uparrow, \quad (1)$$

wherein x=0.01%~50%, y=0.001%~6%, and a weight of $Ga_2O_3$ exceeds 0.01%~10% of a weight of $Ga_2O_3$ determined according to the reaction equation (1) or a total weight of the reactants determined according to the reaction equation (1);
placing the reactants, on which a second preprocessing operation has been performed, into a temperature field device of a crystal growth device, wherein
an observation unit is mounted on the temperature field device and the observation unit includes a through hole and an internal chamber which is communicated with the through hole and the temperature field device, and the through hole is configured for gas passing, the crystal growth device includes an open hearth and the temperature field device is positioned in the hearth, the open hearth has gas exchange with atmospheric environment, and the temperature field device is sealed and has no gas exchange with the atmospheric environment;

introducing a flowing gas into the temperature field device through the through hole after sealing the temperature field device; and activating the crystal growth device to grow the crystal based on a Czochralski technique.

4. The method of claim 3, wherein:
a purity of each of the reactants is greater than 99%,
the purity of each of the reactants is greater than 99.9%,
the purity of each of the reactants is greater than 99.99%, or
the purity of each of the reactants is greater than 99.999%.

5. The method of claim 3, wherein:
the first preprocessing operation includes a roasting operation under 800° C.~1400° C.; and
the second preprocessing operation includes at least one of a room temperature mixing operation or a pressing operation.

6. The method of claim 3, wherein:
the flowing gas includes one or more of oxygen, nitrogen, carbon dioxide, or inert gas;
the flowing gas includes a mixed gas of oxygen and one or more of nitrogen or inert gas; or
the flowing gas includes a mixed gas of carbon dioxide and one or more of nitrogen or inert gas.

7. The method of claim 3, wherein when the flowing gas includes a mixed gas of oxygen and one or more of nitrogen, argon, or inert gas, a volume ratio of oxygen is 0.001%~10%.

8. The method of claim 3, wherein when the flowing gas includes a mixed gas of carbon dioxide and one or more of nitrogen or inert gas, the volume ratio of carbon dioxide is 0.001%~25%.

9. The method of claim 3, wherein a flow rate of the flowing gas is 0.01 L/min~50 L/min.

10. The method of claim 3, wherein:
a purity of the flowing gas is greater than 99%,
the purity of the flowing gas is greater than 99.9%,
the purity of the flowing gas is greater than 99.99%, or
the purity of the flowing gas is greater than 99.999%.

11. The method of claim 3, wherein a rotation rate of a pulling rod of the crystal growth device during the crystal growth is 0.01 rpm~35 rpm.

12. The method of claim 3, wherein a growth rate of the crystal is 0.01 mm/h~6 mm/h during the crystal growth.

13. The method of claim 3, wherein a temperature decreasing time length of the crystal during the crystal growth is 20 hours~100 hours.

14. The method of claim 3, wherein a distance between a seed crystal and an upper surface of the reactants is 5 mm~100 mm during melting the reactants.

15. The method of claim 3, further comprising:
causing a seed crystal to be sunk to 0.1 mm~500 mm below a surface of a melt of the reactants by controlling a pulling rod during a temperature adjustment; and
causing, after the temperature adjustment, the seed crystal to be pulled upwards under a constant temperature at 1900° C.~1930° C. for at least 0.1 hours~2 hours.

16. The method of claim 3, wherein during a shouldering process of the crystal growth, a shoulder angle is 30 degrees~70 degrees and a shoulder length is 40 mm~130 mm.

17. The method of claim 3, wherein during an ending process of the crystal growth, an ending angle is 30 degrees~70 degrees and an ending length is 40 mm~110 mm.

* * * * *